(12) United States Patent
Osawa et al.

(10) Patent No.: US 9,562,948 B2
(45) Date of Patent: Feb. 7, 2017

(54) CONTROL DEVICE FOR SECONDARY BATTERY, AND SOC DETECTION METHOD

(71) Applicant: NISSAN MOTOR CO., LTD., Yokohama-shi, Kanagawa (JP)

(72) Inventors: Yasuhiko Osawa, Yokosuka (JP); Tomohiro Kaburagi, Yokohama (JP); Atsushi Ito, Ebina (JP)

(73) Assignee: NISSAN MOTOR CO., LTD., Yokohama-Shi (JP)

( * ) Notice: Subject to any disclaimer, the term of this patent is extended or adjusted under 35 U.S.C. 154(b) by 315 days.

(21) Appl. No.: 14/383,249

(22) PCT Filed: Feb. 28, 2013

(86) PCT No.: PCT/JP2013/055303
§ 371 (c)(1),
(2) Date: Sep. 5, 2014

(87) PCT Pub. No.: WO2013/133113
PCT Pub. Date: Sep. 12, 2013

(65) Prior Publication Data
US 2015/0022158 A1 Jan. 22, 2015

(30) Foreign Application Priority Data

Mar. 8, 2012 (JP) .................................. 2012-051171
Dec. 7, 2012 (JP) .................................. 2012-268036

(51) Int. Cl.
*H02J 7/00* (2006.01)
*G01R 31/36* (2006.01)
(Continued)

(52) U.S. Cl.
CPC ....... *G01R 31/3606* (2013.01); *G01R 31/3648* (2013.01); *G01R 31/3651* (2013.01);
(Continued)

(58) Field of Classification Search
CPC ........ H01M 4/505; H01M 4/525; H02J 7/007; G01R 31/3624; G01R 31/3651
(Continued)

(56) References Cited

U.S. PATENT DOCUMENTS 5,561,362 A 10/1996 Kawamura et al.
5,606,243 A 2/1997 Sakai et al.
(Continued)

FOREIGN PATENT DOCUMENTS

JP 11-289685 A 10/1999
JP 2000-078757 A 3/2000
(Continued)

OTHER PUBLICATIONS

U.S. Appl. No. 14/383,296, filed Sep. 5, 2014, Nissan Motor Co., Ltd.
(Continued)

*Primary Examiner* — Edward Tso
*Assistant Examiner* — Aaron Piggush
(74) *Attorney, Agent, or Firm* — Foley & Lardner LLP

(57) ABSTRACT

A control device of a secondary battery using, as positive electrode material, positive electrode active material showing a difference of an open circuit voltage curve between during charge and discharge, detects whether the secondary battery is in a charge state or a discharge state. When the secondary battery is in the charge state, the control device calculates, as a current SOC, a value that is lower than an SOC corresponding to a current open circuit voltage of the secondary battery on a reference SOC-open circuit voltage curve showing a relationship between the SOC and the open circuit voltage, which becomes a reference upon calculating the current SOC. When the secondary battery is in the discharge state, the control device calculates as the current SOC, a value that is higher than the SOC corresponding to (Continued)

the current open circuit voltage of the secondary battery on the reference SOC-open circuit voltage curve.

14 Claims, 9 Drawing Sheets

(51) Int. Cl.
  *H01M 4/505* (2010.01)
  *H01M 4/525* (2010.01)
  *H01M 10/48* (2006.01)

(52) U.S. Cl.
  CPC .......... *H01M 4/505* (2013.01); *H01M 4/525* (2013.01); *H01M 10/48* (2013.01); *G01R 31/3624* (2013.01); *H02J 7/007* (2013.01); *Y02E 60/122* (2013.01)

(58) Field of Classification Search
  USPC .... 320/132, 134, 162; 702/63; 324/427, 433
  See application file for complete search history.

(56) References Cited

U.S. PATENT DOCUMENTS

| | | | |
|---|---|---|---|
| 5,703,486 A | 12/1997 | Arai et al. | |
| 5,872,453 A | 2/1999 | Shimoyama et al. | |
| 6,621,250 B1 | 9/2003 | Ohkubo et al. | |
| 7,071,654 B2 | 7/2006 | Suzuki et al. | |
| 7,362,076 B2 | 4/2008 | Namba et al. | |
| 7,459,884 B2 | 12/2008 | Sasaki et al. | |
| 7,471,067 B2 | 12/2008 | Tamezane et al. | |
| 7,974,795 B2 | 7/2011 | Tohyama | |
| 8,193,777 B2 | 6/2012 | Nakashima | |
| 8,487,630 B2 | 7/2013 | Mori | |
| 8,541,986 B2 | 9/2013 | Hiraoka et al. | |
| 8,896,271 B2 | 11/2014 | Kim et al. | |
| 2002/0113595 A1 | 8/2002 | Sakai et al. | |
| 2008/0180064 A1 | 7/2008 | Miki et al. | |
| 2011/0181249 A1 | 7/2011 | Deguchi et al. | |
| 2011/0279088 A1 | 11/2011 | Yamamoto et al. | |
| 2013/0013238 A1 | 1/2013 | Kawakita | |
| 2013/0138370 A1* | 5/2013 | Oh ............... | G01R 31/3624 702/63 |
| 2014/0320141 A1 | 10/2014 | Kaburagi et al. | |

FOREIGN PATENT DOCUMENTS

| | | |
|---|---|---|
| JP | 2000-261905 A | 9/2000 |
| JP | 2001-147260 A | 5/2001 |
| JP | 2004-031012 A | 1/2004 |
| JP | 2007-327971 A | 12/2007 |
| JP | 2008-270201 A | 11/2008 |
| JP | 2011-095209 A | 5/2011 |
| JP | 2011-204563 A | 10/2011 |
| WO | WO-2010/056226 A1 | 5/2010 |

OTHER PUBLICATIONS

USPTO Office Action, U.S. Appl. No. 14/383,296, Jun. 2, 2016, 22 pages.
USPTO Notice of Allowance, U.S. Appl. No. 14/383,296, Oct. 13, 2016, 10 pages.

* cited by examiner

CONTROL DEVICE FOR SECONDARY BATTERY, AND SOC DETECTION METHOD

TECHNICAL FIELD

The present invention relates to a control device of a secondary battery and an SOC detection method of the secondary battery.

BACKGROUND ART

In recent years, for a secondary battery such as a lithium secondary battery, various kinds of materials for positive electrode active material have been studied with the aim of achieving high voltage and high capacity. As such positive electrode active material, for instance, Patent Document 1 discloses solid solution material such as $Li_2MnO_3$—$LiMO_2$ (M is transition metal whose average oxidation state is 3+).

Regarding the solid solution material disclosed in Patent Document 1, depending on its composition etc., there is a case where a hysteresis phenomenon in which an open circuit voltage curve during charge and an open circuit voltage curve during discharge are quite different occurs. Then, when the positive electrode active material showing the occurrence of the hysteresis phenomenon is applied to the secondary battery, due to an influence of the hysteresis phenomenon, even if the open circuit voltage is the same, an SOC of the secondary battery is different between during charge and discharge. Thus, there is a problem that the SOC can not properly detected.

CITATION LIST

Patent Document

Patent Document 1: Japanese Patent Provisional Publication Tokkai No. 2008-270201

SUMMARY OF THE INVENTION

An object of the present invention, which solves the problem, is to properly detect, from the open circuit voltage, a current SOC of the secondary battery using, as the material of the positive electrode, the positive electrode active material that shows the difference of the open circuit voltage curve between during the charge and the discharge.

In the present invention, a control device of a secondary battery using, as a positive electrode material, a positive electrode active material that shows a difference of an open circuit voltage curve between during charge and discharge, detects whether the secondary battery is in a charge state or in a discharge state. When the secondary battery is in the charge state, the control device calculates, as a current SOC of the secondary battery, a value that is lower than a value of an SOC corresponding to a current open circuit voltage of the secondary battery on a predetermined reference SOC-open circuit voltage curve showing a relationship between the SOC and the open circuit voltage, which becomes a reference upon calculating the current SOC of the secondary battery. When the secondary battery is in the discharge state, the control device calculates, as the current SOC of the secondary battery, a value that is higher than the value of the SOC corresponding to the current open circuit voltage of the secondary battery on the reference SOC-open circuit voltage curve. With this calculation, the present invention solves the above problem.

According to the present invention, the reference SOC-open circuit voltage curve showing the relationship between the SOC and the open circuit voltage, which becomes the reference upon calculating the current SOC of the secondary battery is set, and the current SOC of the secondary battery is calculated according to whether the secondary battery is in the charge state or in the discharge state using this reference SOC-open circuit voltage curve. It is therefore possible to properly detect the SOCs during the charge and during the discharge of the secondary battery using, as the positive electrode material, the positive electrode active material that shows the difference of the open circuit voltage curve between during charge and discharge.

DESCRIPTION OF EMBODIMENTS

In the following description, embodiments of the present invention will be explained with reference to the drawings.

First Embodiment

Figure 1:
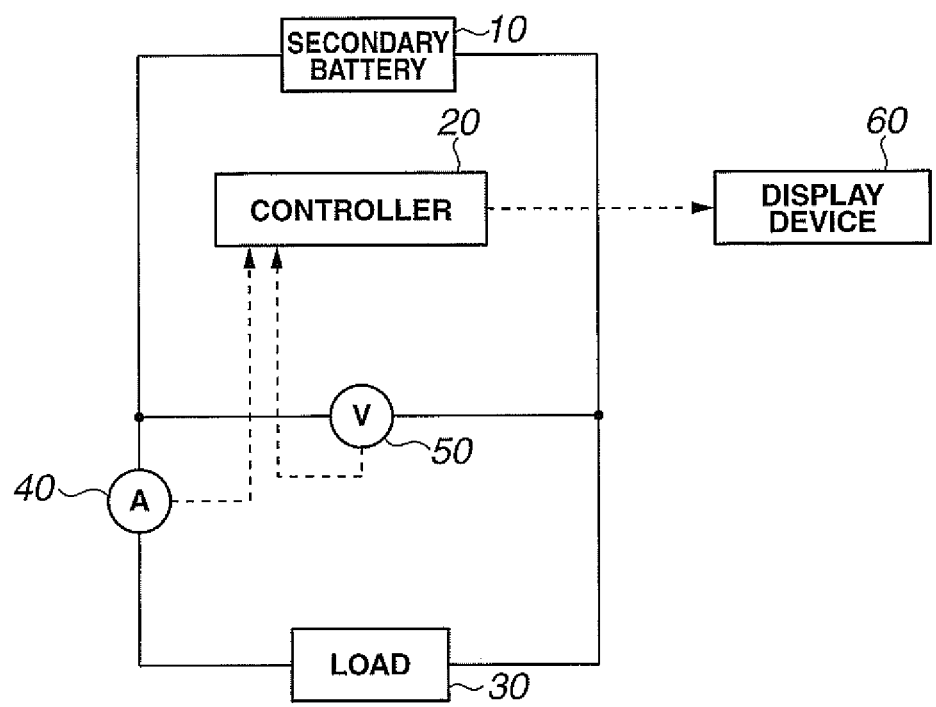
FIG. 1 is a block diagram showing a control system of a secondary battery according to a present embodiment.

FIG. 1 is a block diagram showing a control system of a secondary battery according to a present embodiment. As shown in FIG. 1, the control system of the secondary battery according to the present embodiment has a secondary battery 10, a controller (a control device) 20, a load 30, an ammeter 40, a voltmeter 50 and a display device 60.

The controller 20 is a device to control the secondary battery 10. The controller 20 controls charge and discharge of the secondary battery 10 and also calculates an SOC (State of Charge) of the secondary battery 10 on the basis of a charge-discharge current flowing in the secondary battery 10 which is detected by the ammeter 40 and a terminal voltage of the secondary battery 10 which is detected by the voltmeter 50.

The load 30 is various devices that receive power supply from the secondary battery 10. For instance, in a case where the control system of the secondary battery of the present embodiment is applied to an electric vehicle, the load 30 is a load configured by an inverter and a motor. That is, in the case where the load 30 is configured by the inverter and the motor, a DC power supplied from the secondary battery 10 is converted to an AC power by the inverter, and is supplied to the motor. Further, in the case where the load 30 is configured by the inverter and the motor, a regenerative power generated by rotation of the motor is converted to the DC power through the inverter, and is used to charge the secondary battery 10.

The display device 60 is a device to display information of a current SOC of the secondary battery 10 calculated by the controller 20. For instance, in the case where the control system of the secondary battery of the present embodiment is applied to the electric vehicle, the display device 60 is used to inform an occupant of the electric vehicle of the current SOC of the secondary battery 10.

Figure 2:
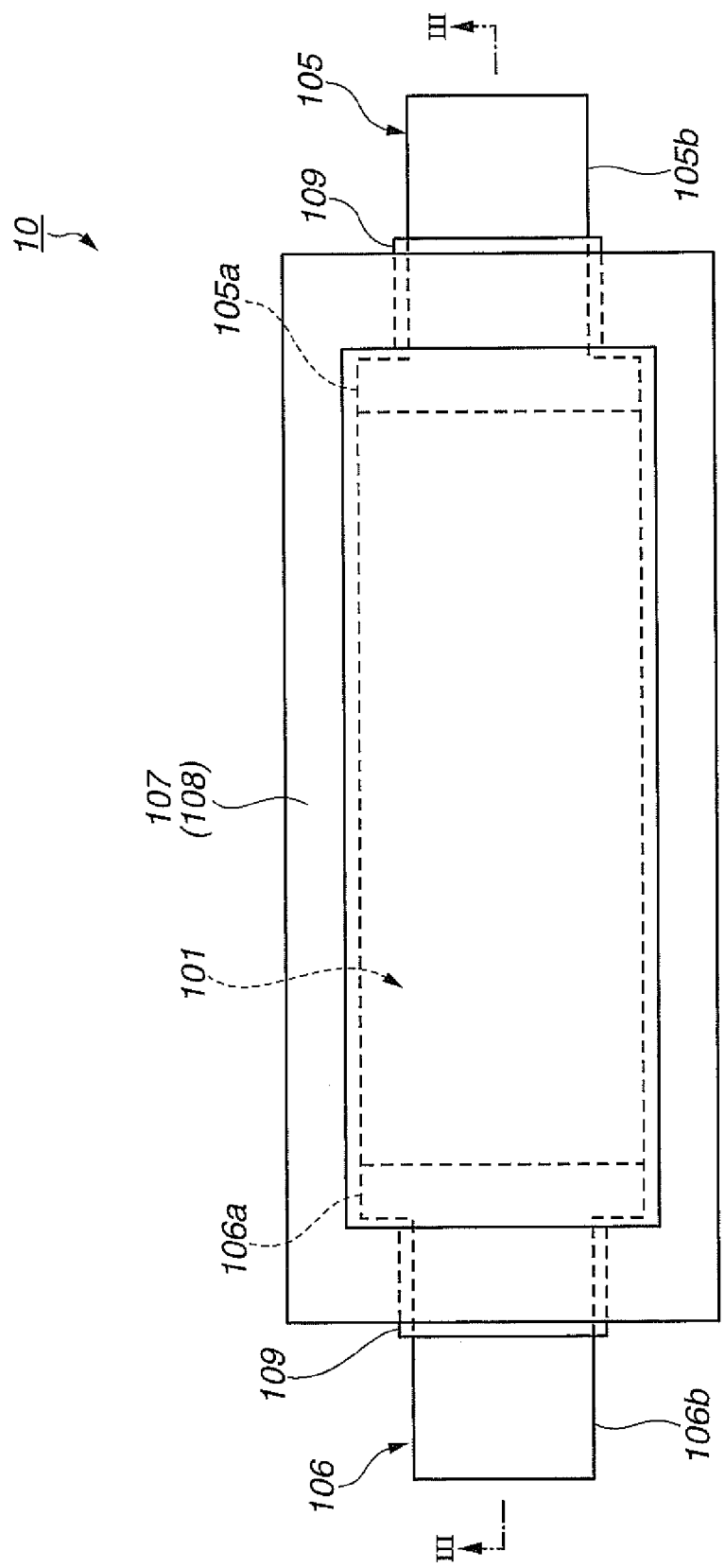
FIG. 2 is a plan view of the secondary battery of the present embodiment.
Figure 3:
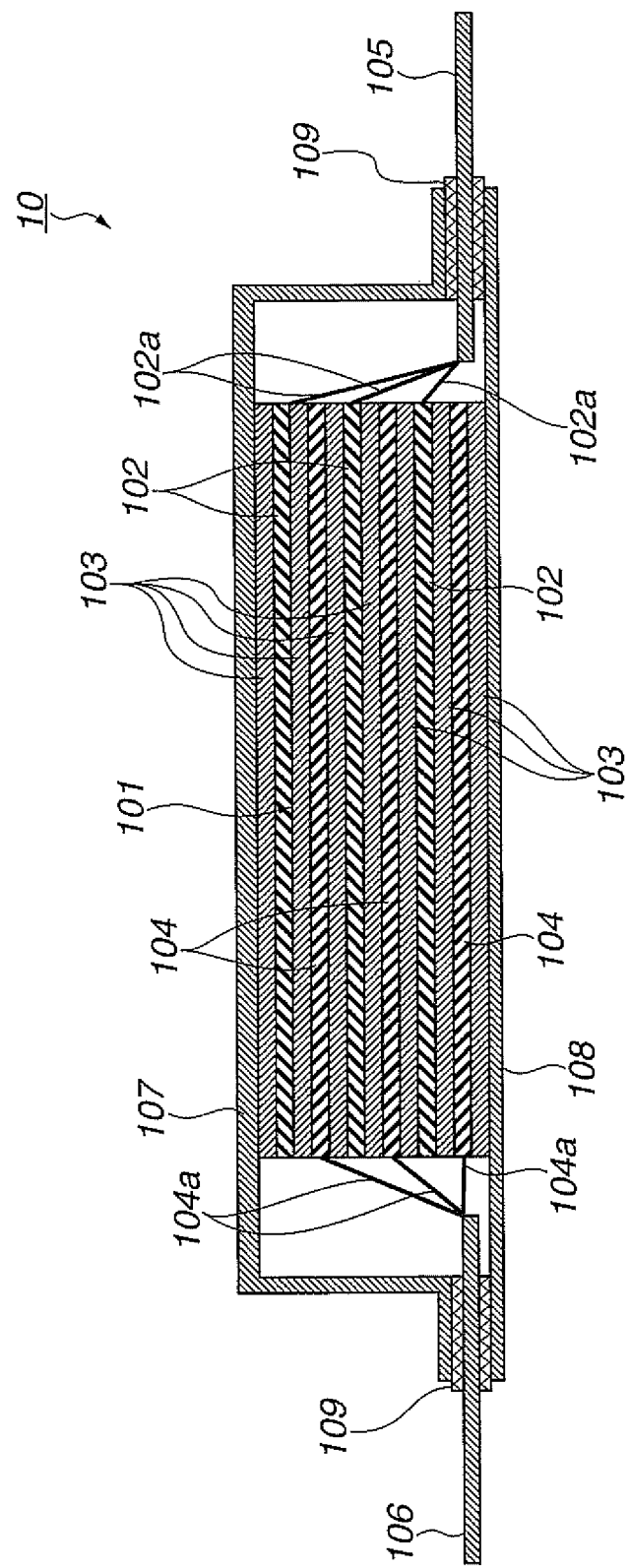
FIG. 3 is a sectional view of the secondary battery, taken along a line III-III of FIG. 2.

As the secondary battery 10, it is, for instance, a lithium-based secondary battery such as a lithium-ion secondary battery. FIG. 2 shows a plan view of the secondary battery 10 of the present embodiment. FIG. 3 shows a sectional view of the secondary battery 10, taken along a line III-III of FIG. 2.

As shown in FIGS. 2 and 3, the secondary battery 10 is formed from an electrode layered unit (an electrode stack) 101 having three positive electrode plates 102, seven separators 103 and three negative electrode plates 104, a positive electrode tab 105 and a negative electrode tab 106 which are each connected to the electrode stack 101, an upper jacket member 107 and a lower jacket member 108 which accommodate therebetween these electrode stack 101, positive electrode tab 105 and negative electrode tab 106 and seals them, and electrolyte (not shown).

Here, the number of each of the positive electrode plate 102, the separator 103 and the negative electrode plate 104 is not especially limited. The electrode stack 101 could be formed by one positive electrode plate 102, three separators 103 and one negative electrode plate 104. Further, the number of each of the positive electrode plate 102, the separator 103 and the negative electrode plate 104 could be selected as necessary.

The positive electrode plate 102 forming the electrode stack 101 has a positive electrode side current collector 102a that extends up to the positive electrode tab 105 and positive electrode active material layers that are formed on both main surfaces of a part of the positive electrode side current collector 102a. As the positive electrode side current collector 102a forming the positive electrode plate 102, it is, for instance, electrochemically stable metal leaf (or electrochemically stable metal foil) such as aluminium leaf (or foil), aluminium alloy leaf (or foil), copper titanium leaf (or foil) and stainless leaf (or foil), each of which has about 20 μm thickness.

The positive electrode active material layer forming the positive electrode plate 102 is formed by applying a mixture of positive electrode active material, a conductive agent such as carbon black and a binding agent such as aqueous dispersion of polyvinylidene fluoride or polytetrafluoroethylene to the main surfaces of apart of the positive electrode side current collector 102a and by drying and pressing them.

The secondary battery 10 of the present embodiment contains, as the positive electrode active material in the positive electrode active material layer forming the positive electrode plate 102, at least positive electrode active material that shows a difference of an open circuit voltage curve between during the charge and the discharge, i.e. positive electrode active material having hysteresis in a charge-discharge curve. As such the positive electrode active material showing the difference of the open circuit voltage curve between during the charge and the discharge, it is not especially limited. It is, for instance, a compound expressed by the following general expression (1). In particular, since the compound expressed by the following general expression (1) has high potential (high voltage) and high capacity, using this compound as the positive electrode active material enables the secondary battery 10 to have high energy density. Here, the compound expressed by the following general expression (1) normally forms solid solution.

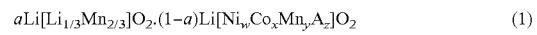
$$aLi[Li_{1/3}Mn_{2/3}]O_2 \cdot (1-a)Li[Ni_w Co_x Mn_y A_z]O_2 \quad (1)$$

(0<a<1, w+x+y+z=1, 0≤w, x, y, z≤1, A is metallic element)

In the compound expressed by the above general expression (1), as the "A", it is not especially limited as long as the "A" is the metallic element (metallic element except Li, Ni, Co and Mn). However, at least one element selected from Fe, V, Ti, Al and Mg is preferable, and Ti is far preferable.

Further, in the compound expressed by the above general expression (1), although the "w", "x", "y", "z" are not especially limited as long as the "w", "x", "y", "z" meet w+x+y+z=1 and 0≤x, y, z≤1, it is preferable that z be 0 (z=0). That is, it is preferable that the compound be a compound expressed by the following general expression (2).

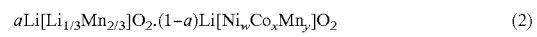
$$aLi[Li_{1/3}Mn_{2/3}]O_2 \cdot (1-a)Li[Ni_w Co_x Mn_y]O_2 \quad (2)$$

(0<a<1, w+x+y=1, 0≤w, x, y≤1)

Here, the positive electrode active material layer could contain positive electrode active material except the positive electrode active material showing the difference of the open circuit voltage curve between during the charge and the discharge, for instance, lithium compound oxide such as lithium nickelate ($LiNiO_2$), lithium manganate ($LiMn_2O_4$) and lithium cobalt oxide (lithium cobaltate) ($LiCoO_2$), $LiFePO_4$ and $LiMnPO_4$.

Each of the positive electrode side current collectors 102a forming the three positive electrode plates 102 is connected to the positive electrode tab 105. As the positive electrode tab 105, for instance, aluminium leaf (or foil), aluminium alloy leaf (or foil), copper leaf (or foil) and nickel leaf (or foil), each of which has about 0.2 mm thickness, could be used.

The negative electrode plate 104 forming the electrode stack 101 has a negative electrode side current collector 104a that extends up to the negative electrode tab 106 and negative electrode active material layers that are formed on both main surfaces of a part of the negative electrode side current collector 104a.

The negative electrode side current collector 104a of the negative electrode plate 104 is, for instance, electrochemically stable metal leaf (or electrochemically stable metal foil) such as nickel leaf (or foil), copper leaf (or foil), stainless leaf (or foil) and iron leaf (or foil), each of which has about 10 µm thickness.

The negative electrode active material layer forming the negative electrode plate 104 is formed, for example, as follows. By preparing a slurry by adding a binding agent such as polyvinylidene and a solvent such as N-2-methyl-pyrrolidone to negative electrode active material such as non-graphitizable carbon, graphitizable carbon and graphite, and by applying the slurry to the both main surfaces of a part of the negative electrode side current collector 104a, then by drying and pressing them, the negative electrode active material layer is formed.

In the secondary battery 10 of the present embodiment, the three negative electrode plates 104 are formed so that each of the negative electrode side current collectors 104a forming the negative electrode plates 104 is connected to the single negative electrode tab 106. That is, in the secondary battery 10 of the present embodiment, each negative electrode plate 104 is formed so as to connect to the single common negative electrode tab 106.

The separator 103 of the electrode stack 101 is an element that prevents a short circuit between the positive electrode plate 102 and the negative electrode plate 104. The separator 103 might have a function of holding the electrolyte. This separator 103 is a macroporous film formed from, for instance, polyolefine such as polyethylene (PE) and polypropylene (PP) each having about 25 µm thickness, which also has a function of interrupting current by the fact that when overcurrent (excess current) flows, pores on the layer are closed by heat of the overcurrent.

As shown in FIG. 3, by alternately arranging the positive electrode plate 102 and the negative electrode plate 104 in layers through the separator 103 and also by arranging the separator 103 on an uppermost layer and a lowermost layer of this layered arrangement, the electrode stack 101 is formed.

The electrolyte which the secondary battery 10 contains is liquid obtained by dissolving, as a solute, lithium salt such as lithium tetrafluoroborate ($LiBF_4$) and lithium hexafluorophosphate ($LiPF_6$) in organic liquid solvent. As the organic liquid solvent forming the electrolyte, it is, for instance, ester-based solvent such as propylene carbonate (PC), ethylene carbonate (EC), buthylene carbonate (BC), dimethyl carbonate (DMC), ethyl methyl carbonate (EMC), diethyl carbonate (DEC), methyl formate (MF), methyl acetate (MA) and methyl propionate (MP). These could be used as a mixture.

The electrode stack 101 formed in this manner is accommodated between and sealed with the upper jacket member 107 (sealing means or element) and the lower jacket member 108 (sealing means or element). The upper jacket member 107 and the lower jacket member 108 to seal the electrode stack 101 are formed by material having flexibility, e.g. a resin film such as polyethylene and polypropylene or a resin-metal thin film laminate material obtained by bonding (or laminating) resin such as the polyethylene and the polypropylene onto both surfaces of metal foil such as aluminum. By thermal-bonding (heat-bonding) these upper jacket member 107 and lower jacket member 108, the electrode stack 101 is sealed with the positive electrode tab 105 and the negative electrode tab 106 coming out to the outside.

The positive electrode tab 105 and the negative electrode tab 106 are each provided with a seal film 109 to secure absolute contact with the upper jacket member 107 and the lower jacket member 108 at portions where each of the positive electrode tab 105 and the negative electrode tab 106 contacts the upper jacket member 107 and the lower jacket member 108. As the seal film 109, it is not especially limited. It can be formed from, for instance, synthetic resin material having excellent resistance of electrolyte and good thermal adhesion performance such as polyethylene, modified polyethylene, polypropylene, modified polypropylene and ionomer.

The secondary battery 10 of the present embodiment is formed in the manner described above.

Next, a charge-discharge characteristic of the secondary battery 10 of the present embodiment will be explained.

Figure 4:
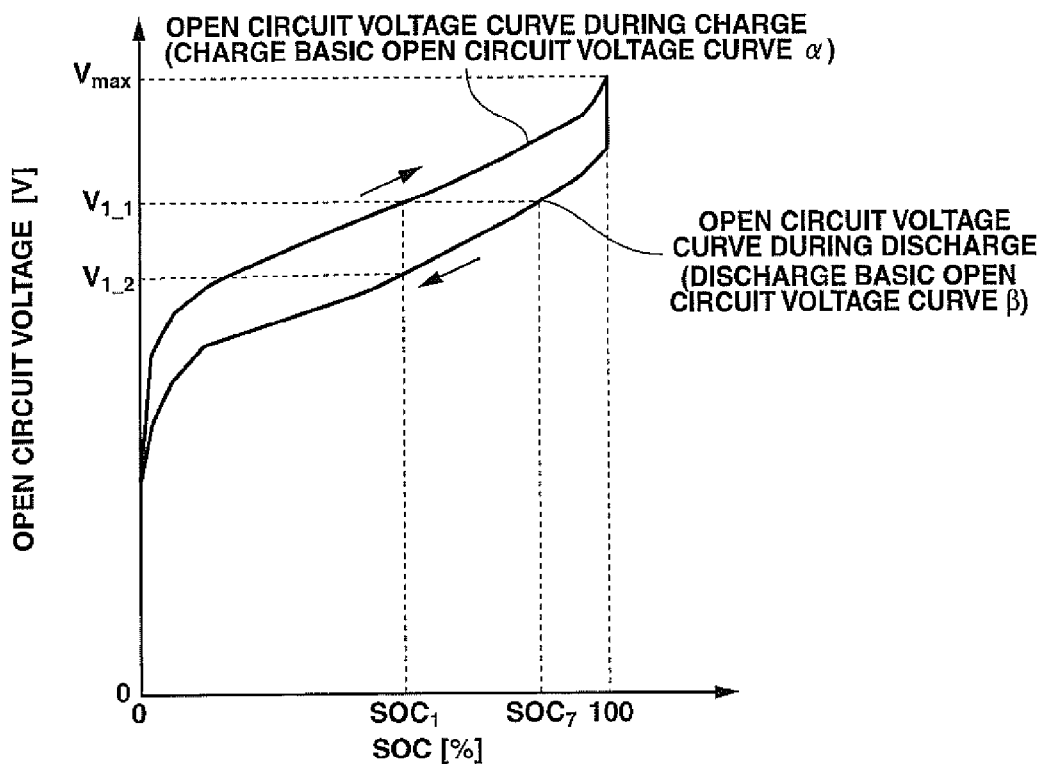
FIG. 4 is a graph showing a charge-discharge characteristic of the secondary battery of the present embodiment when performing a charge and a discharge from SOC=0% to SOC=100%.

As described above, the secondary battery 10 uses, as the positive electrode active material, the positive electrode active material showing the difference of the open circuit voltage curve between during the charge and the discharge, i.e. the positive electrode active material having the hysteresis in the charge-discharge curve. Because of this, as shown in FIG. 4, in a case where the charge is performed from SOC=0% to SOC=100% and afterwards the discharge is performed from SOC=100% to SOC=0%, the open circuit voltage curve during the charge and the open circuit voltage curve during the discharge are different, and the secondary battery 10 has the hysteresis. Here, in the present embodiment, as shown in FIG. 4, a charge open circuit voltage curve when performing the charge from SOC=0% to SOC=100% is called a charge basic open circuit voltage curve α, and a discharge open circuit voltage curve when performing the discharge from SOC=100% to SOC=0% is called a discharge basic open circuit voltage curve β. That is, as shown in FIG. 4, when charging the secondary battery 10 from SOC=0%, an open circuit voltage of the secondary battery 10 is increased with rise of the SOC according to or along the charge basic open circuit voltage curve α shown in FIG. 4. Then, when discharging the secondary battery 10 by changing (switching) the state of the secondary battery 10 from the charge to the discharge after the secondary battery 10 is fully charged up to a predetermined fully charged state, i.e. a fully charged voltage Vmax (SOC=100%), the secondary battery 10 is discharged according to or along the discharge basic open circuit voltage curve β shown in FIG. 4.

That is, as shown in FIG. 4, the secondary battery 10 has properties that, even same SOC, a value of the open circuit voltage is quite different between during the charge and the discharge. For this reason, even though the SOC is a same $SOC_1$ as shown in FIG. 4, the open circuit voltage during the charge is $V_{1\_1}$, whereas the open circuit voltage during the discharge is $V_{1\_2}$, then a voltage difference $\Delta V = V_{1\_1} - V_{1\_2}$ arises at the charge and the discharge.

Here, in FIG. 4, the case where the charge is performed from SOC=0% to SOC=100% and afterwards the discharge is performed from SOC=100% to SOC=0% is explained as an example. However, even in a case where such a charge-discharge operation is performed at an arbitrary SOC (for instance, the charge is performed from SOC=30% to SOC=70% and the discharge is performed from SOC=70% to SOC=30%), in the same manner as the above case, the secondary battery 10 has the hysteresis in the charge-discharge curve.

Figure 5:
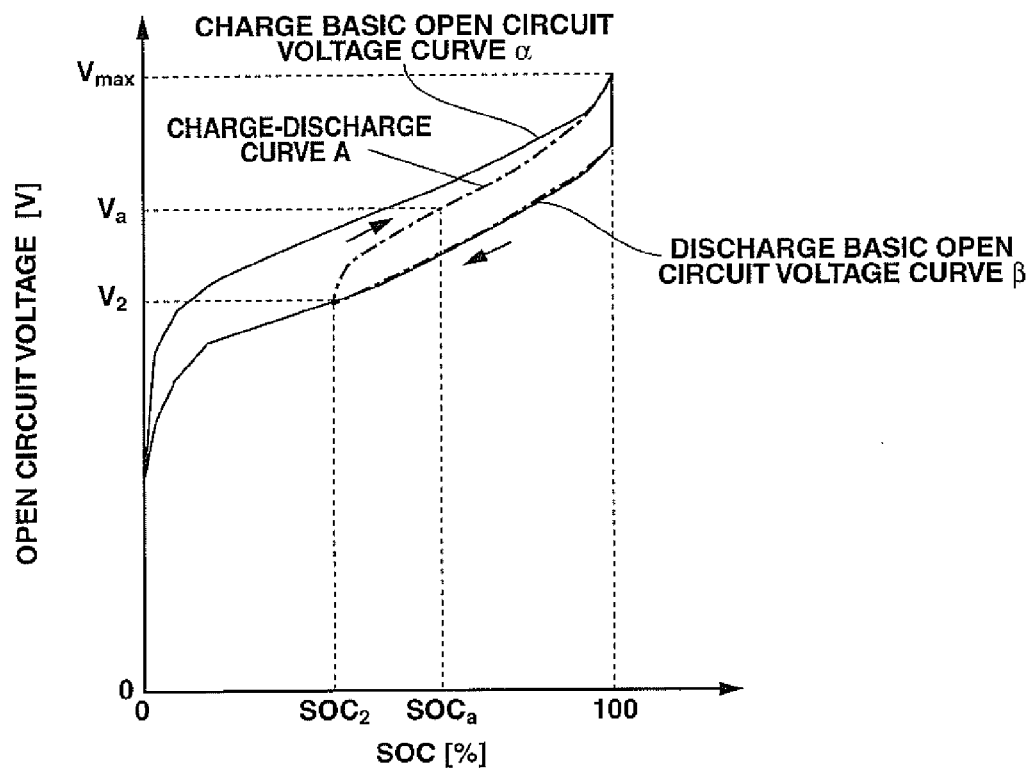
FIG. 5 is a graph showing a charge-discharge characteristic of the secondary battery of the present embodiment when changing a charge-discharge state of the secondary battery from a discharge to a charge at an arbitrary SOC ($SOC_2$) after performing the discharge along a discharge basic open circuit voltage curve β.

On the other hand, as shown in FIG. 5 as a charge-discharge curve A (indicated by a dashed line in FIG. 5), in a case where, after the discharge is performed from a predetermined fully charged voltage Vmax up to $SOC_2$, the state is changed (switched) from the discharge to the charge then the charge is performed up to the fully charged voltage Vmax, the charge-discharge curve becomes the following curve. That is, in a case where the discharge is performed according to or along the discharge basic open circuit voltage curve β during the discharge and afterwards the charge is performed by changing (switching) the state from the discharge to the charge at $SOC_2$, a charge curve is different from the charge basic open circuit voltage curve α. However, when the discharge is performed again after the charge is performed up to the predetermined fully charged voltage Vmax, the discharge is performed according to or along the discharge basic open circuit voltage curve β.

Figure 6:
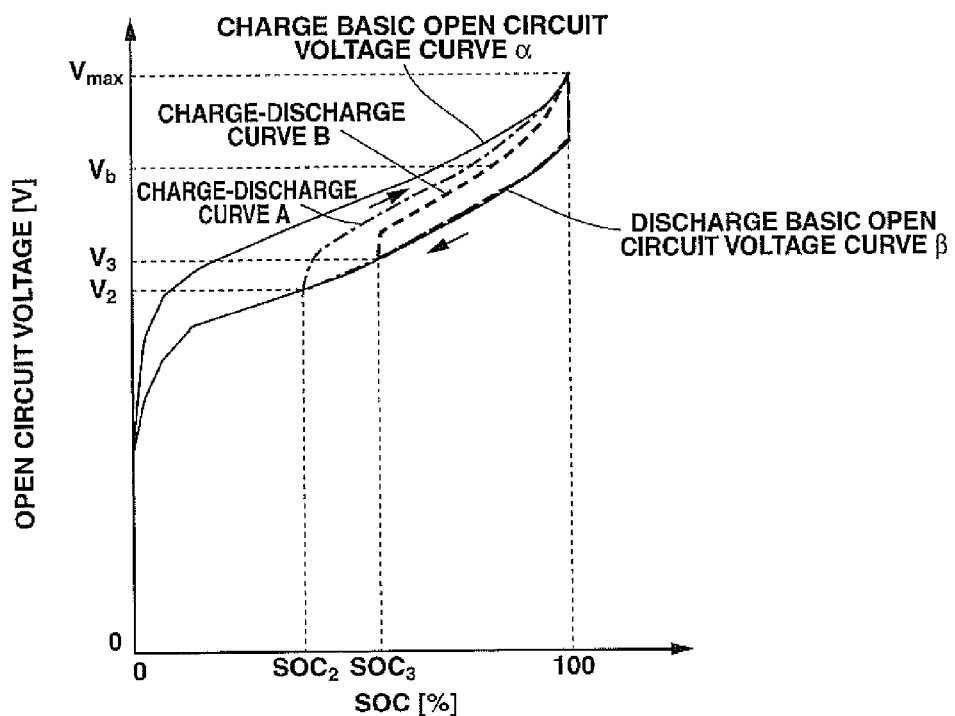
FIG. 6 is a graph showing a charge-discharge characteristic of the secondary battery of the present embodiment when changing the charge-discharge state of the secondary battery from a discharge to a charge at an arbitrary SOC ($SOC_2$, $SOC_3$) after performing the discharge along a discharge basic open circuit voltage curve β.

Likewise, as shown in FIG. 6 as a charge-discharge curve B (indicated by a broken line in FIG. 6), a part of which is superposed on or fitted to the charge-discharge curve A (indicated by a dashed line in FIG. 6), also in a case where, after the discharge is performed up to $SOC_3$ that is different from the above SOC of the charge-discharge curve A, the state is changed (switched) from the discharge to the charge then the charge is performed up to the fully charged voltage Vmax, the same tendency (or the same characteristic) appears. That is, in either case of FIG. 5 and FIG. 6, when discharging the secondary battery 10 from the predetermined fully charged voltage Vmax, the discharge is performed according to or along the discharge basic open circuit voltage curve β. This tendency (this characteristic) is not dependent on an SOC (e.g. $SOC_2$ and $SOC_3$ in FIG. 5 and FIG. 6) at a time of charging start when charging the secondary battery 10 up to the predetermined fully charged voltage Vmax. That is, in the case where the discharge is performed from the predetermined fully charged voltage Vmax, regardless of a charge-discharge history before the discharge, the discharge is performed uniformly according to or along the discharge basic open circuit voltage curve β.

Consequently, in the present embodiment, on the basis of such charge-discharge characteristics of the secondary battery 10, by previously storing the discharge basic open circuit voltage curve β that is a discharge curve when performing the discharge from the predetermined fully charged voltage Vmax in the controller 20 and by using this discharge basic open circuit voltage curve β, the SOC of the secondary battery 10 when performing the discharge from the predetermined fully charged voltage Vmax is calculated by the controller 20. A specific calculating manner of the SOC will be described later.

Further, in the present embodiment, as described above, as shown in FIGS. 5 and 6, in the case where the discharge is performed according to or along the discharge basic open circuit voltage curve β and afterwards the charge is performed by changing (switching) the state from the discharge to the charge at a predetermined SOC (i.e. $SOC_2$, $SOC_3$), the open circuit curve during the charge is different from each charging changeover $SOC_{charge}$ when changing the state from the discharge to the charge. More specifically, as shown in FIGS. 5 and 6, when performing the charge by changing the state from the discharge to the charge at $SOC_2$, the charge is performed according to or along the charge-discharge curve A, whereas when performing the charge by changing the state from the discharge to the charge at $SOC_3$, the charge is performed according to or along the charge-discharge curve B. That is, as shown in FIG. 6, even in a case where the open circuit voltage is a same $V_b$, the charge-discharge curve is different between the charge-discharge curve A whose charging changeover $SOC_{charge}$ is $SOC_2$ and the charge-discharge curve B whose charging changeover $SOC_{charge}$ is $SOC_3$.

Because of this, in the present embodiment, on the basis of such charge-discharge characteristics of the secondary battery 10, the open circuit curve during the charge in the case where the discharge is performed according to or along the discharge basic open circuit voltage curve β and afterwards the charge is performed again by changing the state from the discharge to the charge is previously stored as a re-charge open circuit voltage curve $\gamma_{SOC}$ for each charging changeover $SOC_{charge}$ in the controller 20 together with the discharge basic open circuit voltage curve β described above. Then, in the present embodiment, in a situation where the discharge is performed according to or along the discharge basic open circuit voltage curve β and afterwards the charge is performed again by changing the state from the discharge to the charge, by using this re-charge open circuit voltage curve $\gamma_{SOC}$ stored for each charging changeover $SOC_{charge}$, the calculation of the SOC of the secondary battery 10 is executed by the controller 20. A specific calculating manner of the SOC will be described later.

Figure 7:
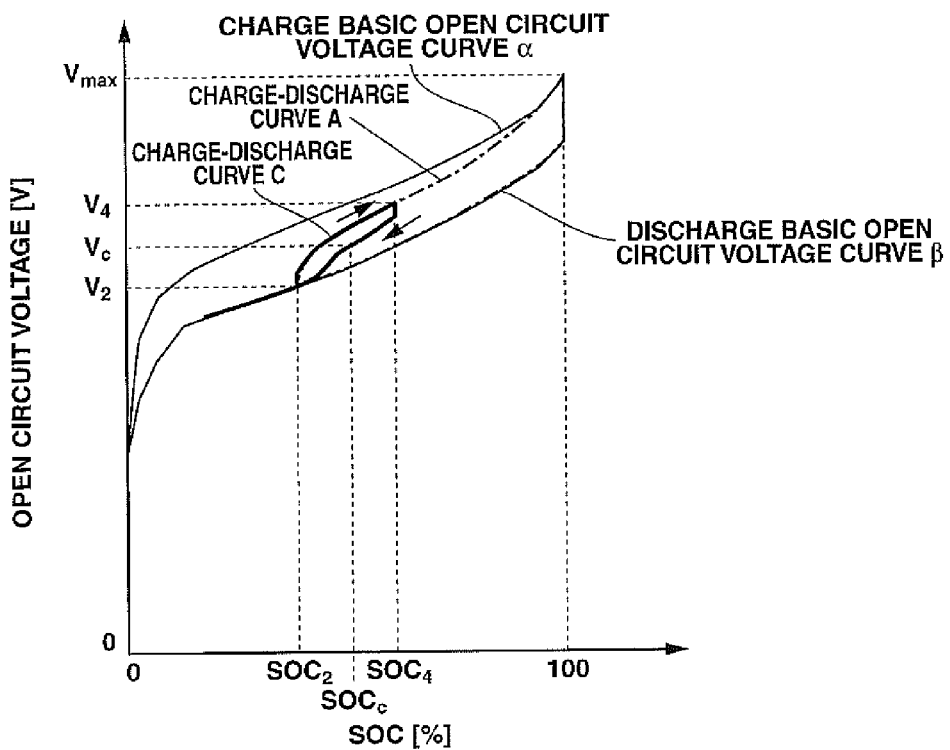
FIG. 7 is a graph showing a charge-discharge characteristic of the secondary battery of the present embodiment when changing the charge-discharge state of the secondary battery from the charge to the discharge at an arbitrary SOC ($SOC_4$) after performing the charge along a re-charge open circuit voltage curve $\gamma_{SOC}$.

Further, in the present embodiment, as shown in FIG. 7, in a case where, after discharging the secondary battery 10 according to or along the discharge basic open circuit voltage curve β, the charge is performed by changing the state from the discharge to the charge at $SOC_2$, as indicated by a charge-discharge curve C in FIG. 7, the charge is performed according to or along the re-charge open circuit voltage curve $\gamma_{SOC}$ (i.e. an open circuit voltage curve corresponding to the charge-discharge curve A) that corresponds to $SOC_2$, which is described above. Then, when the charge is performed up to $SOC_4$ and the discharge is performed again by changing (switching) the state from the charge to the discharge, as indicated by the charge-discharge curve C in FIG. 7, the discharge is performed up to $SOC_2$ that is the charging changeover $SOC_{charge}$ according to or along a discharge curve corresponding to $SOC_4$ that is an SOC at a time when changing the state from the charge to the discharge. Further, when the SOC passes through $SOC_2$ of the charging changeover $SOC_{charge}$, the discharge is performed according to or along the discharge basic open circuit voltage curve β.

Here, the charge-discharge curve C shown in FIG. 7 is a curve that indicates an open circuit voltage curve during the charge and the discharge when the following charge-discharge operation is performed.

Figure 8:
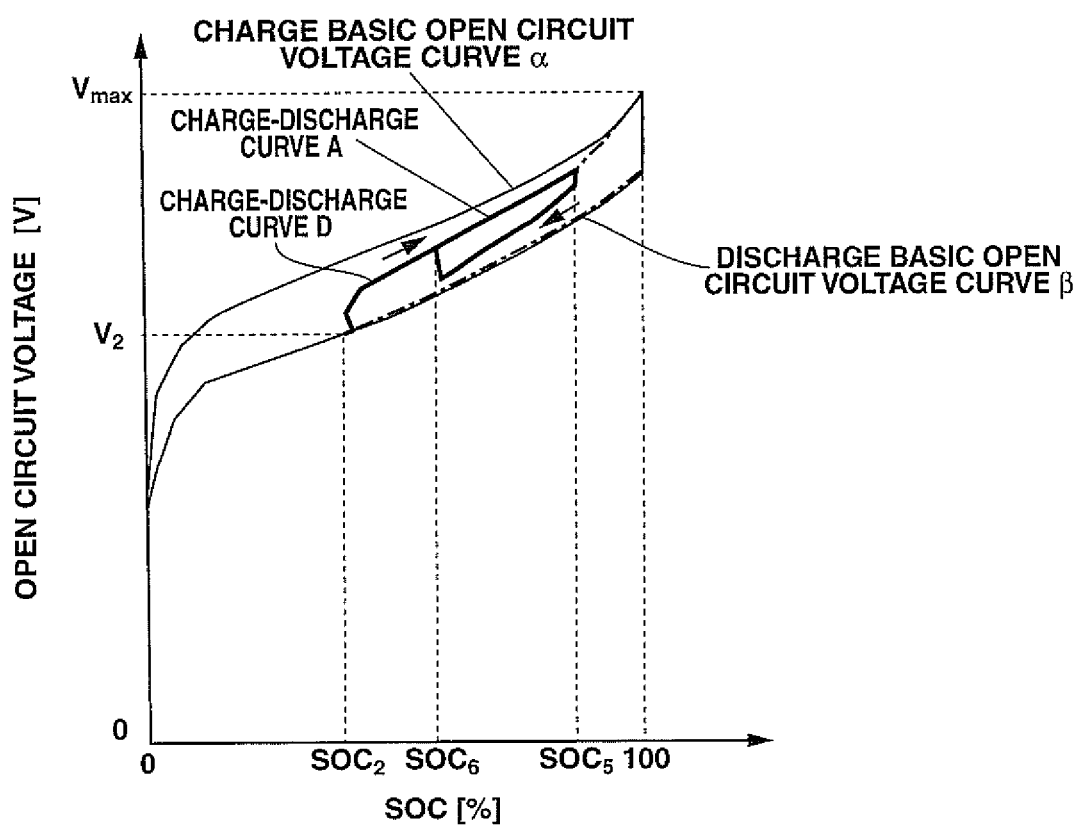
FIG. 8 is a graph showing a charge-discharge characteristic of the secondary battery of the present embodiment when changing the charge-discharge state of the secondary battery from the charge to the discharge at an arbitrary SOC ($SOC_5$) after performing the charge along the re-charge open circuit voltage curve $\gamma_{SOC}$.

(1) after the discharge is performed according to or along the discharge basic open circuit voltage curve β, the charge is performed up to $SOC_4$ by changing (switching) the state from the discharge to the charge at $SOC_2$, and (2) the state is changed from the charge to the discharge at $SOC_4$, and the discharge is performed up to an arbitrary SOC beyond $SOC_2$ Furthermore, as indicated by a charge-discharge curve D in FIG. 8, in a case where, after performing the discharge according to or along the discharge basic open circuit voltage curve β and performing the charge according to or along the re-charge open circuit voltage curve $\gamma_{SOC}$ (i.e. the open circuit voltage curve corresponding to the charge-discharge curve A) by changing the state from the discharge to the charge at $SOC_2$ in the same manner as the charge-discharge curve C shown in FIG. 7, the discharge is performed again by changing the state from the charge to the discharge at $SOC_5$ that is different from SOC of the charge-discharge curve C shown in FIG. 7, the open circuit curve during the discharge is different as shown in FIGS. 7 and 8.

Here, the charge-discharge curve D shown in FIG. 8 is a curve that indicates an open circuit voltage curve during the charge and the discharge when the following charge-discharge operation is performed.

(1) after the discharge is performed according to or along the discharge basic open circuit voltage curve β, the charge is performed up to $SOC_5$ by changing (switching) the state from the discharge to the charge at $SOC_2$,
(2) the state is changed from the charge to the discharge at $SOC_5$, and the discharge is performed up to $SOC_6$, and
(3) the state is changed from the discharge to the charge at $SOC_6$, and the charge is performed up to an arbitrary SOC Here, as can be seen from FIGS. 7 and 8, as indicated by the charge-discharge curves C and D, in the case where, after performing the charge according to or along the re-charge open circuit voltage curve $\gamma_{SOC}$ (i.e. the open circuit voltage curve corresponding to the charge-discharge curve A), the discharge is performed by changing the state from the charge to the discharge, the open circuit curve during the discharge is different from each discharging changeover SOC that is an SOC at a time when changing the state from the charge to the discharge. However, regarding this open circuit voltage during the discharge, as indicated by the charge-discharge curve C in FIG. 7, in the case where the discharge is performed by changing the state from the charge to the discharge at $SOC_4$, the discharge is performed up to $SOC_2$ that is the charging changeover $SOC_{charge}$ according to or along the discharge curve corresponding to $SOC_4$ that is the SOC at a time when changing the state from the charge to the discharge. On the other hand, when the SOC passes through $SOC_2$ of the charging changeover $SOC_{charge}$, the discharge is performed according to or along the discharge basic open circuit voltage curve β.

In addition, as indicated by the charge-discharge curve D in FIG. 8, in the case where the discharge is performed by changing the state from the charge to the discharge at $SOC_5$, the discharge is performed according to or along a discharge curve corresponding to $SOC_5$ that is the SOC at a time when changing the state from the charge to the discharge. On the other hand, when charging the secondary battery 10 again before reaching $SOC_2$ of the charging changeover $SOC_{charge}$, the charge is performed according to or along the re-charge open circuit voltage curve $\gamma_{SOC}$ again.

That is, from the charge-discharge curves C and D shown in FIGS. 7 and 8, in the case where, after performing the charge according to or along the re-charge open circuit voltage curve $\gamma_{SOC}$, the discharge is performed by changing the state from the charge to the discharge, the secondary battery 10 has the following characteristic.

(A) the open circuit curve during the discharge is different from each discharging changeover $SOC_{discharge}$ that is the SOC at a time when changing the state from the charge to the discharge
(B) when performing the discharge beyond the charging changeover $SOC_{charge}$ according to the re-charge open circuit voltage curve $\gamma_{SOC}$, the discharge is performed according to or along the discharge basic open circuit voltage curve β, and
(C) when performing the charge by changing the state from the discharge to the charge before reaching the charging changeover $SOC_{charge}$ according to the re-charge open circuit voltage curve $\gamma_{SOC}$, the charge is performed according to or along the re-charge open circuit voltage curve $\gamma_{SOC}$ regardless of the SOC when changing the state to the charge Therefore, in the light of the above characteristic (A), the present embodiment is configured so that the open circuit curve during the discharge in the case where the charge is performed according to or along the re-charge open circuit voltage curve $\gamma_{SOC}$ and afterwards the discharge is performed again by changing the state from the charge to the discharge is previously stored as a re-discharge open circuit voltage curve $\delta_{\gamma\text{-}SOC}$ for each charging changeover $SOC_{charge}$ and each discharging changeover $SOC_{discharge}$ in the controller 20. That is, in the present embodiment, the re-discharge open circuit voltage curve $\delta_{\gamma\text{-}SOC}$ corresponding to each discharging changeover $SOC_{discharge}$ is previously stored for each charging changeover $SOC_{charge}$ in the controller 20. Then, in the present embodiment, in a situation as shown in FIGS. 7 and 8, i.e. in a situation where, after performing the discharge according to or along the discharge basic open circuit voltage curve β and performing the charge by changing the state from the discharge to the charge, the discharge is performed again, by using this re-discharge open circuit voltage curve $\delta_{\gamma\text{-}SOC}$, the calculation of the SOC of the secondary battery 10 is executed by the controller 20. A specific calculating manner of the SOC will be described later.

Here, in the present embodiment, as the re-discharge open circuit voltage curve $\delta_{\gamma\text{-}SOC}$ mentioned above, it is determined in the light of the above characteristics of (B) and (C) in addition to the characteristic (A). That is, in the light of the characteristic of (B), before reaching the charging changeover $SOC_{charge}$ according to the re-charge open circuit voltage curve $\gamma_{SOC}$, the open circuit curve during the discharge is the open circuit curve corresponding to the discharging changeover $SOC_{discharge}$, whereas when passing through the charging changeover $SOC_{charge}$, the open circuit curve during the discharge is the open circuit curve moving according to or along the discharge basic open circuit voltage curve β. Further, in the light of the characteristic of (C), when performing the charge again before reaching the charging changeover $SOC_{charge}$ according to the re-charge open circuit voltage curve $\gamma_{SOC}$, the charge is performed according to or along the re-charge open circuit voltage curve $\gamma_{SOC}$. Thus, in the light of these characteristics, as the re-discharge open circuit voltage curve $\delta_{\gamma\text{-}SOC}$, data of the open circuit curve during the discharge up to the corresponding charging changeover $SOC_{charge}$ according to the re-charge open circuit voltage curve $\gamma_{SOC}$ is stored. Accordingly, the present embodiment is configured so that the data up to the corresponding charging changeover $SOC_{charge}$ according to the re-charge open circuit voltage curve $\gamma_{SOC}$ is stored as the re-discharge open circuit voltage curve $\delta_{\gamma\text{-}SOC}$.

Regarding the discharge basic open circuit voltage curve β, in the present embodiment, for instance, the discharge basic open circuit voltage curve β can be obtained by an actual measurement of data collected when actually charging the secondary battery 10 up to the predetermined fully charged voltage Vmax and afterwards actually discharging the secondary battery 10. Likewise, regarding the re-charge open circuit voltage curve $\gamma_{SOC}$ and the re-discharge open circuit voltage curve $\delta_{\gamma\text{-}SOC}$, they can also be obtained by an actual measurement of data collected when performing the charge and the discharge with a predetermined SOC being a starting point.

In FIGS. 4 to 8, as an example, the charge-discharge characteristic in the case of configuration where the compound expressed by the general expression (2) is used as the positive electrode active material and this positive electrode active material and the graphite negative electrode are combined is shown. However, the present invention is not limited to this combination or configuration.

Figure 9:
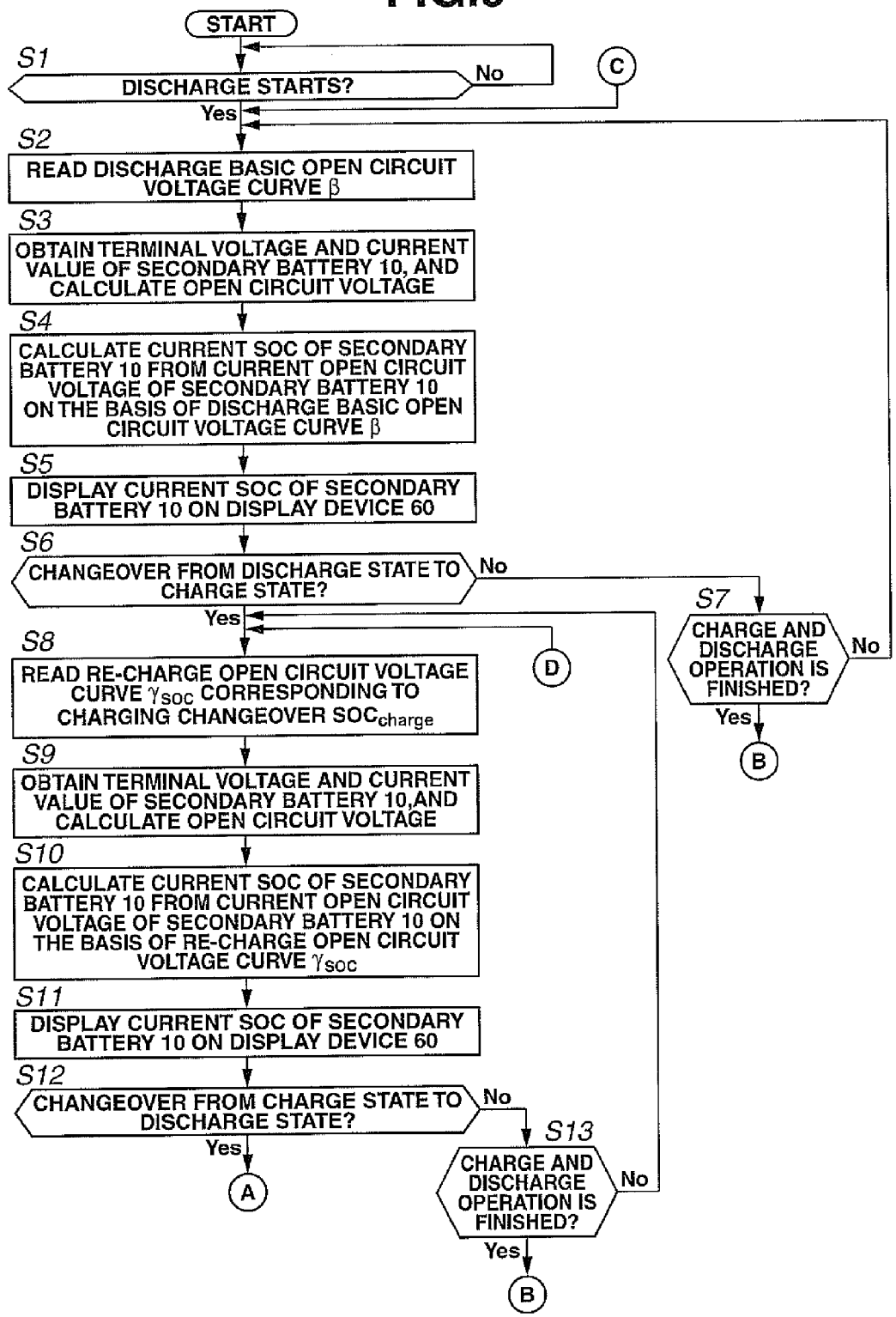
FIG. 9 is a flow chart (a first flow chart) showing a process executed in the control system of the secondary battery according to the present embodiment.
Figure 10:
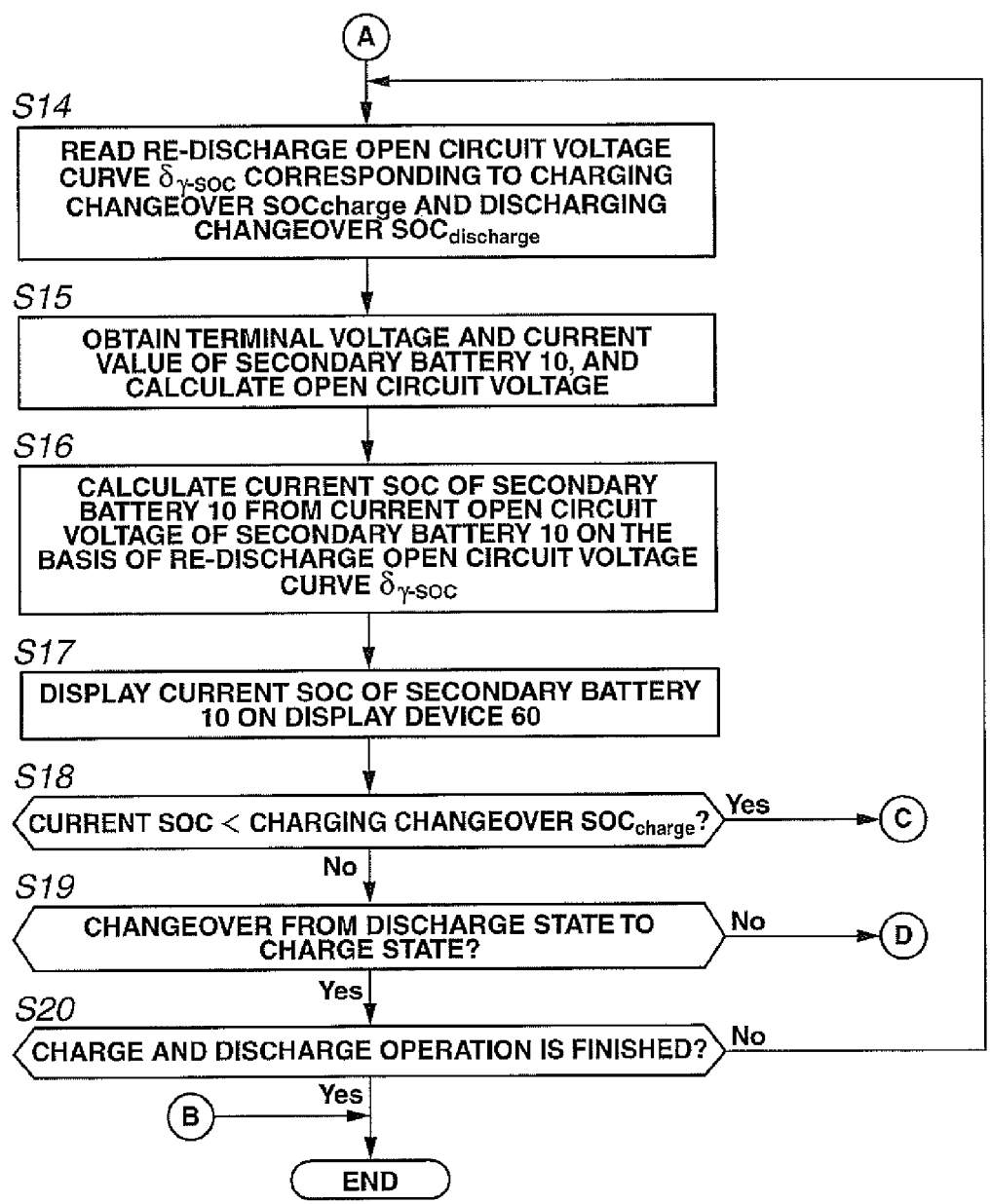
FIG. 10 is a flow chart (a second flow chart) showing a process executed in the control system of the secondary battery according to the present embodiment.

Next, an example of operation of the present embodiment will be explained. FIGS. 9 and 10 are flow charts showing an SOC calculation process in the present embodiment. In the following description, an example of operation in a case where the secondary battery 10 is charged up to the predetermined fully charged voltage Vmax and afterwards the discharge of the secondary battery 10 is performed will be explained. Further, in the following description, the example of operation of the present embodiment will be explained with reference to the respective specific cases shown in FIGS. 4 to 8.

First, at step S1, a judgment is made as to whether or not the discharge of the secondary battery 10 from the fully charged state is started by the controller 20. If the discharge is started, the routine proceeds to step S2. On the other hand, if the discharge is not started, the routine waits at step S1.

At step S2, an operation of reading the discharge basic open circuit voltage curve β previously stored in the controller 20 is performed by the controller 20.

Subsequently, at step S3, an operation of obtaining the terminal voltage of the secondary battery 10 measured by the voltmeter 50 and the current value of the secondary battery 10 measured by the ammeter 40 then calculating a current open circuit voltage of the secondary battery 10 from the terminal voltage obtained and the current value of the secondary battery 10 obtained is performed by the controller 20. Here, as a calculating manner of the current open circuit voltage of the secondary battery 10, it is not especially limited. For instance, it could be a manner in which, using a plurality of data of the terminal voltage and the current value of the secondary battery 10, a value of the terminal voltage when the current value is zero is estimated from the plurality of data of the terminal voltage and the current value using a regression line, and this value is calculated as the open circuit voltage.

At step S4, an operation of calculating a current SOC of the secondary battery 10 from the current open circuit voltage of the secondary battery 10 calculated at step S3 on the basis of the discharge basic open circuit voltage curve β read at step S2 is performed by the controller 20. When explaining the case shown in FIG. 4, as an example, for instance, in a case where the current open circuit voltage of the secondary battery 10 calculated at step S3 is $V_{1\_2}$, an SOC corresponding to the open circuit voltage $V_{1\_2}$, i.e. $SOC_1$ is calculated from the discharge basic open circuit voltage curve β as the current SOC of the secondary battery 10.

At step S5, information of the current SOC of the secondary battery 10 calculated at step S4 is sent from the controller 20 to the display device 60, and an operation of displaying the information of the current SOC of the secondary battery 10 on the display device 60 is performed.

Subsequently, at step S6, a judgment is made as to whether or not an operation of the changeover from the discharge state to the charge state is performed by the controller 20. That is, a judgment is made as to whether or not the discharge is finished then the charge is started. If the operation of the changeover from the discharge state to the charge state is not performed, the routine proceeds to step S7. Then, until a predetermined finishing operation of the charge and discharge is performed (Yes at step 7), or until the operation of the changeover from the discharge state to the charge state is performed (Yes at step S6), processes at steps S2 to S7 are repeated. That is, the calculation of the current SOC of the secondary battery 10 during the discharge is repeated using the discharge basic open circuit voltage curve β.

On the other hand, if the predetermined finishing operation of the charge and discharge is performed at step S7, the present operation is terminated. Further, when judged that the operation of the changeover from the discharge state to the charge state is performed at step S6, the routine proceeds to step S8.

At step S8, an operation of setting the SOC of the secondary battery 10 when performing the operation of the changeover from the discharge state to the charge state to the charging changeover $SOC_{charge}$ is performed by the controller 20. Further, an operation of reading the re-charge open circuit voltage curve $\gamma_{SOC}$ corresponding to the charging changeover $SOC_{charge}$, which is previously stored in the controller 20, is performed by the controller 20. That is, for instance, as shown in FIG. 5, in the case where the charging changeover $SOC_{charge}$ is $SOC_2$, an operation of reading the re-charge open circuit voltage curve $\gamma_{SOC}$ (i.e. the open circuit voltage curve corresponding to the charge-discharge curve A) corresponding to $SOC_2$ is performed.

Subsequently, at step S9, an operation of obtaining the terminal voltage of the secondary battery 10 measured by the voltmeter 50 and the current value of the secondary battery 10 measured by the ammeter 40 then calculating a current open circuit voltage of the secondary battery 10 from the terminal voltage obtained and the current value of the secondary battery 10 obtained is performed by the controller 20. Here, as the calculating manner of the current open circuit voltage of the secondary battery 10, it could be the same manner as that at step S3 mentioned above.

At step S10, an operation of calculating a current SOC of the secondary battery 10 from the current open circuit voltage of the secondary battery 10 calculated at step S9 on the basis of the re-charge open circuit voltage curve $\gamma_{SOC}$ corresponding to the charging changeover $SOC_{charge}$ read at step S8 is performed by the controller 20. When explaining the case shown in FIG. 5, as an example, for instance, in a case where the current open circuit voltage of the secondary battery 10 calculated at step S9 is $V_a$, an SOC corresponding to the open circuit voltage $V_a$, i.e. $SOC_a$ is calculated, as the current SOC of the secondary battery 10, from the re-charge open circuit voltage curve $\gamma_{SOC}$ (i.e. the open circuit voltage curve corresponding to the charge-discharge curve A) corresponding to $SOC_2$ that is the charging changeover $SOC_{charge}$.

At step S11, information of the current SOC of the secondary battery 10 calculated at step S10 is sent from the controller 20 to the display device 60, and an operation of displaying the information of the current SOC of the secondary battery 10 on the display device 60 is performed.

Subsequently, at step S12, a judgment is made as to whether or not an operation of the changeover from the charge state to the discharge state is performed by the controller 20. That is, a judgment is made as to whether or not the charge is finished then the discharge is started. If the operation of the changeover from the charge state to the discharge state is not performed, the routine proceeds to step S13. Then, until a predetermined finishing operation of the charge and discharge is performed (Yes at step S13), or until the operation of the changeover from the charge state to the discharge state is performed (Yes at step S12), processes at steps S8 to S13 are repeated. That is, the calculation of the current SOC of the secondary battery 10 during the charge is repeated using the re-charge open circuit voltage curve $\gamma_{SOC}$ corresponding to the charging changeover $SOC_{charge}$. For instance, when explaining the case shown in FIG. 5, the calculation of the current SOC of the secondary battery 10 during the charge is repeated using the re-charge open circuit voltage curve $\gamma_{SOC}$ (i.e. the open circuit voltage curve corresponding to the charge-discharge curve A) corresponding to $SOC_2$.

On the other hand, if the predetermined finishing operation of the charge and discharge is performed at step S13, the present operation is terminated. Further, when judged that the operation of the changeover from the charge state to the discharge state is performed at step S12, the routine proceeds to step S14 shown in FIG. 10.

At step S14, an operation of setting the SOC of the secondary battery 10 when performing the operation of the changeover from the charge state to the discharge state again to the discharging changeover $SOC_{discharge}$ is performed by the controller 20. Further, an operation of reading the re-discharge open circuit voltage curve $\delta_{\gamma\text{-}SOC}$ corresponding to the charging changeover $SOC_{charge}$ and the discharging changeover $SOC_{discharge}$, which is previously stored in the controller 20, is performed by the controller 20. For instance, when explaining the case shown in FIG. 7, as indicated by the charge-discharge curve C in FIG. 7, in the case where the charge is performed according to or along the re-charge open circuit voltage curve $\gamma_{SOC}$ (i.e. the open circuit voltage curve corresponding to the charge-discharge curve A) corresponding to $SOC_2$, when the changeover from the charge state to the discharge state is performed at $SOC_4$, an operation of reading the re-discharge open circuit voltage curve $\delta_{\gamma\text{-}SOC}$ when the charging changeover $SOC_{charge}$ is $SOC_2$ and the discharging changeover $SOC_{discharge}$ is $SOC_4$, i.e. an operation of reading the open circuit voltage curve corresponding to the charge-discharge curve C, is performed.

Subsequently, at step S15, an operation of obtaining the terminal voltage of the secondary battery 10 measured by the voltmeter 50 and the current value of the secondary battery 10 measured by the ammeter 40 then calculating a current open circuit voltage of the secondary battery 10 from the terminal voltage obtained and the current value of the secondary battery 10 obtained is performed by the controller 20. Here, as the calculating manner of the current open circuit voltage of the secondary battery 10, it could be the same manner as that at step S3 mentioned above.

At step S16, an operation of calculating a current SOC of the secondary battery 10 from the current open circuit voltage of the secondary battery 10 calculated at step S15 on the basis of the re-discharge open circuit voltage curve $\delta_{\gamma\text{-}SOC}$ corresponding to the charging changeover $SOC_{charge}$ and the discharging changeover $SOC_{discharge}$ read at step S14 is performed by the controller 20. When explaining the case shown in FIG. 7, as an example, for instance, in a case where the current open circuit voltage of the secondary battery 10 calculated at step S15 is $V_c$, an SOC corresponding to the open circuit voltage $V_c$, i.e. $SOC_c$ is calculated, as the current SOC of the secondary battery 10, from the re-discharge open circuit voltage curve $\delta_{\gamma\text{-}SOC}$ (i.e. the open circuit voltage curve corresponding to the charge-discharge curve C) corresponding to $SOC_2$ that is the charging changeover $SOC_{charge}$ and $SOC_4$ that is the discharging changeover $SOC_{discharge}$.

At step S17, information of the current SOC of the secondary battery 10 calculated at step S16 is sent from the controller 20 to the display device 60, and an operation of displaying the information of the current SOC of the secondary battery 10 on the display device 60 is performed.

Next, at step S18, a judgment is made as to whether or not a value of the current SOC of the secondary battery 10 calculated at step S16 is lower than the charging changeover $SOC_{charge}$ by the controller 20. That is, when explaining the case shown in FIG. 7, as an example, a judgment is made as to whether or not the discharge starts from $SOC_4$ that is the discharging changeover $SOC_{discharge}$ and is continuously performed beyond $SOC_2$ that is the charging changeover $SOC_{charge}$. If the discharge is performed beyond $SOC_2$ that is the charging changeover $SOC_{charge}$, as described above, since the discharge afterwards is performed according to or along the discharge basic open circuit voltage curve β (see FIG. 7), the routine returns to step S2, then the calculation process of the current SOC of the secondary battery 10 is performed using the discharge basic open circuit voltage curve β at steps S2 to S7 described above.

On the other hand, if the value of the current SOC of the secondary battery 10 is higher than $SOC_2$ that is the charging changeover $SOC_{charge}$, until the discharge is performed beyond $SOC_2$ that is the charging changeover $SOC_{charge}$ (Yes at step S18), or until the operation of the changeover from the discharge state to the charge state is performed (Yes at step S19), or until the charge and discharge finishing operation is performed (Yes at step S20), processes at steps S14 to S20 are repeatedly performed. That is, the calculation of the current SOC of the secondary battery 10 is repeatedly executed by the controller 20 using the re-discharge open circuit voltage curve $\delta_{\gamma\text{-}SOC}$ (i.e. the open circuit voltage curve corresponding to the charge-discharge curve C) corresponding to $SOC_2$ that is the charging changeover $SOC_{charge}$ and $SOC_4$ that is the discharging changeover $SOC_{discharge}$.

If the operation of the changeover from the discharge state to the charge state is performed by the controller 20 at step S19, as indicated by the charge-discharge curve D in FIG. 8, since the charge is performed according to or along the re-charge open circuit voltage curve $\gamma_{SOC}$ (i.e. the open circuit voltage curve corresponding to the charge-discharge curve A) corresponding to $SOC_2$ that is the charging changeover $SOC_{charge}$, in this case, the routine returns to step S8. Then, the calculation of the current SOC of the secondary battery 10 is executed using the re-charge open circuit voltage curve $\gamma_{SOC}$ (i.e. the open circuit voltage curve corresponding to the charge-discharge curve A) corresponding to $SOC_2$ that is the charging changeover $SOC_{charge}$ at steps S8 to S13. Further, if the predetermined finishing operation of the charge and discharge is performed at step S20, the present operation is terminated.

According to the present embodiment, the discharge curve when performing the discharge from the predetermined fully charged state, i.e. the fully charged voltage Vmax (SOC=100%) is previously stored as the discharge basic open circuit voltage curve β, then when the discharge is performed from the predetermined fully charged voltage Vmax, the current SOC of the secondary battery 10 is calculated from the current open circuit voltage of the secondary battery 10 on the basis of the discharge basic open circuit voltage curve β. Therefore, the current SOC of the secondary battery 10 when performing the discharge from the predetermined fully charged voltage Vmax can be accurately calculated. Especially when the control system of the secondary battery of the present embodiment is applied to the electric vehicle, since normally the secondary battery 10 is used after being charged up to the predetermined fully charged state, in this case, the discharge is performed according to or along the discharge basic open circuit voltage curve β. Thus, by using the discharge basic open circuit voltage curve β, it is possible to properly or rightly calculate the current SOC of the secondary battery 10.

Further, according to the present embodiment, the charge curve when the discharge is performed from the predetermined fully charged state and afterwards the state is changed from the discharge to the charge is previously stored as the re-charge open circuit voltage curve $\gamma_{SOC}$ for each charging changeover $SOC_{charge}$. Then, in the case where the discharge is performed from the predetermined fully charged state and afterwards the charge is performed again, the current SOC of the secondary battery 10 is calculated from the current open circuit voltage of the secondary battery 10 on the basis of the re-charge open circuit voltage curve $\gamma_{SOC}$. Therefore, according to the present embodiment, in addition to the case where the discharge is performed from the predetermined fully charged state, even when the charge is performed again, the current SOC of the secondary battery 10 can be accurately calculated.

In addition, according to the present embodiment, the discharge curve when the discharge is performed from the predetermined fully charged state and the charge is performed again then afterwards the state is changed again from the charge to the discharge is previously stored as the re-discharge open circuit voltage curve $\delta_{\gamma\text{-}SOC}$ for each charging changeover $SOC_{charge}$ and each discharging changeover $SOC_{discharge}$. Then, in the case where the discharge is performed from the predetermined fully charged state and the charge is performed then afterwards the discharge is performed again, the current SOC of the secondary battery 10 is calculated from the current open circuit voltage of the secondary battery 10 on the basis of the re-discharge open circuit voltage curve $\delta_{\gamma\text{-}SOC}$. Therefore, according to the present embodiment, even when the discharge is performed from the predetermined fully charged state and the charge is performed then afterwards the discharge is performed again, the current SOC of the secondary battery 10 can be accurately calculated.

Especially when the control system of the secondary battery of the present embodiment is applied to the electric vehicle, normally the secondary battery 10 is used after being charged up to the predetermined fully charged state. Thus, by previously storing the re-discharge open circuit voltage curve $\delta_{\gamma\text{-}SOC}$ for each charging changeover $SOC_{charge}$ and each discharging changeover $SOC_{discharge}$ in addition to the discharge basic open circuit voltage curve β and the re-charge open circuit voltage curve $\gamma_{SOC}$ for each charging changeover $SOC_{charge}$ then by calculating the current SOC of the secondary battery 10 using these curves, the current SOC of the secondary battery 10 can be accurately calculated in a wide variety of situations.

Second Embodiment

Next, a second embodiment of the present invention will be explained.

In the second embodiment of the present invention, the SOC of the secondary battery 10 is calculated using a reference SOC-open circuit voltage curve δ explained below. Configuration and operation of the second embodiment except this calculation are the same as those of the first embodiment described above.

As explained above, the secondary battery 10 of the present embodiment has the characteristics or properties that, as shown in FIGS. 4 to 8, when comparing the open circuit voltage during the charge and the open circuit voltage during the discharge at the same SOC, the open circuit voltage during the charge is higher, and the open circuit voltage during the discharge is lower. For instance, as shown in FIG. 4, even when the SOC is the same $SOC_1$, the open circuit voltage during the charge is $V_{1\_1}$, whereas the open circuit voltage during the discharge is $V_{1\_2}$, and the secondary battery 10 has the characteristics or properties that the open circuit voltage during the charge is higher. Such characteristics or properties appear even in the case where the charge and the discharge are performed from any SOC as shown in FIGS. 5 to 8.

In addition to the characteristics or properties above, the secondary battery 10 of the present embodiment has the following characteristics or properties. That is, when comparing the SOC during the charge and the SOC during the discharge at the same open circuit voltage, the SOC during the charge is lower, and the SOC during the discharge is higher. For instance, as shown in FIG. 4, even when the open circuit voltage is the same $V_{1\_1}$, the SOC during the charge is $SOC_1$, whereas the SOC during the discharge is $SOC_7$, and the secondary battery 10 has the characteristics or properties that the SOC during the charge is lower. Such characteristics or properties appear even in the case where the charge and the discharge are performed from any SOC as shown in FIGS. 5 to 8.

Figure 11:
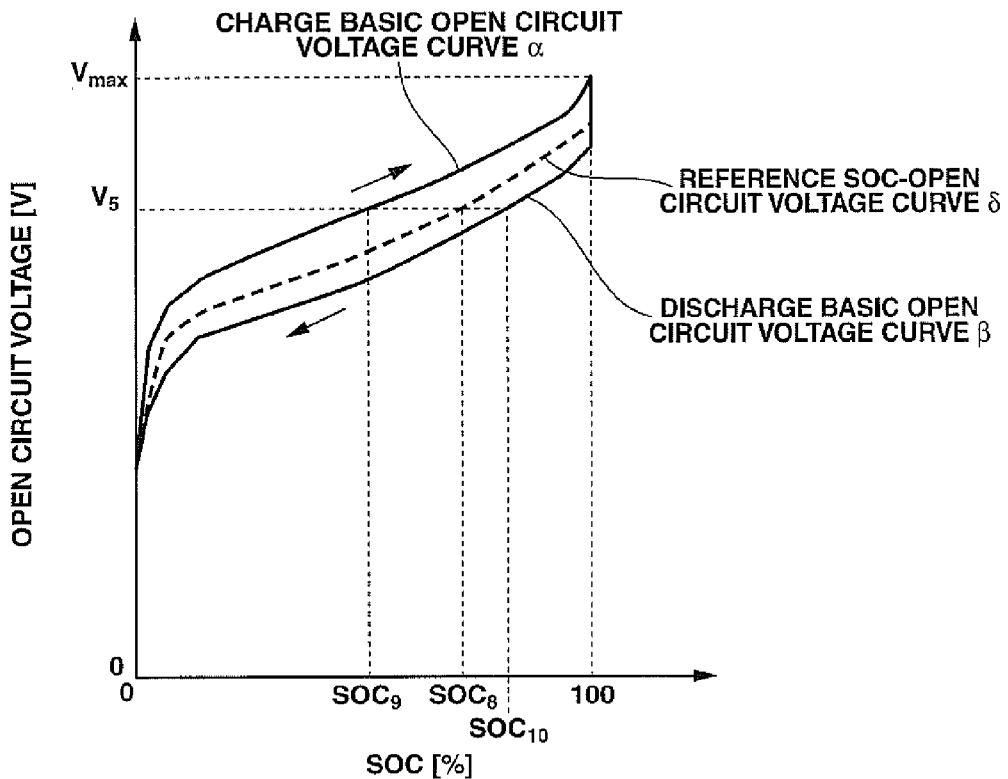
FIG. 11 is a drawing showing an example of a reference SOC-open circuit voltage curve δ set in the control system of the secondary battery according to the present embodiment.

Therefore, in the present embodiment, the current SOC of the secondary battery 10 is calculated using these characteristics or properties. That is, in the present embodiment, as shown in FIG. 11, between the charge basic open circuit voltage curve α that is the charge open circuit voltage curve when performing the charge from SOC=0% to SOC=100% and the discharge basic open circuit voltage curve β that is the discharge open circuit voltage curve when performing the discharge from SOC=100% to SOC=0%, the reference SOC-open circuit voltage curve δ showing a relationship between the SOC and the open circuit voltage which is a reference upon calculating the current SOC of the secondary battery 10 is set. Then, the current SOC of the secondary battery 10 is calculated using this reference SOC-open circuit voltage curve δ. As a setting manner of the reference SOC-open circuit voltage curve δ, it is not especially limited. For instance, it could be a manner in which a plurality of operations of the charge and discharge of the secondary battery 10 from a plurality of various SOCs are performed then the reference SOC-open circuit voltage curve δ is set on the basis of SOC-open circuit voltage curves obtained. Here, in this case, it is preferable to set the reference SOC-open circuit voltage curve δ from the SOC-open circuit voltage curves obtained so that the reference SOC-open circuit voltage curve δ is positioned in a middle position between the curve during the charge and the curve during the discharge.

Then, in the present embodiment, as shown in FIG. 11, when the open circuit voltage of the secondary battery 10 is $V_5$, an SOC corresponding to the open circuit voltage $V_5$ on the reference SOC-open circuit voltage curve δ is $SOC_8$. In contrast, an SOC corresponding to the open circuit voltage $V_5$ during the charge is an SOC that is lower than $SOC_8$, and an SOC corresponding to the open circuit voltage $V_5$ during the discharge is an SOC that is higher than $SOC_8$. For instance, as shown in FIG. 11, in the case where the charge is performed according to or along the charge basic open circuit voltage curve α, the SOC corresponding to the open circuit voltage $V_5$ is $SOC_9$ that is lower than $SOC_8$. On the other hand, in the case where the discharge is performed according to or along the discharge basic open circuit voltage curve β, the SOC corresponding to the open circuit voltage $V_5$ is $SOC_{10}$ that is higher than $SOC_8$.

Therefore, in the present embodiment, an SOC corresponding to the open circuit voltage of the secondary battery 10 on the reference SOC-open circuit voltage curve δ is determined as a corresponding $SOC_{ref}$. Then, during the charge, an SOC (=$SOC_{ref} \times C_{charge}$) that is calculated by correcting the corresponding $SOC_{ref}$ by a predetermined correction factor $C_{charge}$ that is less than 1 ($C_{charge}<1$) is calculated as the current SOC of the secondary battery 10. Further, during the discharge, an SOC (=$SOC_{ref} \times C_{discharge}$) that is calculated by correcting the corresponding $SOC_{ref}$ by a predetermined correction factor $C_{discharge}$ that is greater than 1 ($C_{discharge}>1$) is calculated as the current SOC of the secondary battery 10. Here, as the correction factors $C_{charge}$ and $C_{discharge}$ used for this calculation, they are not especially limited. Each of them could be a predetermined certain constant, or might be a variable that is set with consideration given to the charge-discharge characteristic of the secondary battery 10.

For instance, as shown in FIG. 6, as a tendency, the secondary battery 10 of the present embodiment has properties that, during the charge, the higher the SOC at a charge start is (i.e. the closer to the fully charged state the SOC at a charge start is), the higher the SOC (i.e. the closer to the reference SOC-open circuit voltage curve δ the SOC) even at the same open circuit voltage. Thus, the present embodiment could be configured to set the correction factor $C_{charge}$ so that, during the charge, the higher the SOC at the charge start is, the closer to 1 the value of the correction factor $C_{charge}$. Likewise, as shown in FIGS. 7 and 8, as a tendency, the secondary battery 10 of the present embodiment has properties that, during the discharge, the lower the SOC at a discharge start is (i.e. the closer to a fully discharged state the SOC at a discharge start is), the lower the SOC (i.e. the closer to the reference SOC-open circuit voltage curve δ the SOC) even at the same open circuit voltage. Thus, the present embodiment could be configured to set the correction factor $C_{discharge}$ so that, during the discharge, the lower the SOC at the discharge start is, the closer to 1 the value of the correction factor $C_{discharge}$.

As explained above, according to the second embodiment, the reference SOC-open circuit voltage curve δ is set, then on the basis of the reference SOC-open circuit voltage curve δ, the current SOC of the secondary battery 10 is calculated according to whether the secondary battery 10 is in the charge state or in the discharge state. Thus, the current SOC of the secondary battery 10, using the positive electrode active material showing the difference of the open circuit voltage curve between during the charge and the discharge, can be calculated accurately and relatively easily.

Although the embodiments of the present invention has been explained above, the embodiments are described in order to facilitate an understanding of the present invention, and are not described to limit the present invention. Thus, each element or component disclosed in the above embodiments includes all design modifications and equivalents belonging to the technical scope of the present invention.

For instance, the above first embodiment shows the example in which, as the discharge basic open circuit voltage curve β when performing the discharge from the predetermined fully charged state, the open circuit voltage curve when performing the discharge from the fully charged voltage Vmax of SOC=100% is used. However, as the discharge basic open circuit voltage curve β, an open circuit voltage curve according to a battery design of the secondary battery 10 or a charge-discharge system design that actually uses the secondary battery 10 could be set. That is, for instance, it is not necessarily required that the predetermined fully charged state be set to an ideal fully charged state (this is a 100% charged state) that is considered from the positive electrode active material and the negative electrode active material forming the secondary battery 10. For example, a 95% charged state, which is slightly lower than the ideal fully charged state, could be set as the predetermined fully charged state. However, from the viewpoint of enhancing the effects of the present embodiments, it is desirable to set the predetermined fully charged state to a state that is close to the 100% charged state.

Further, in the above first present embodiment, instead of the discharge basic open circuit voltage curve β, the re-charge open circuit voltage curve $\gamma_{SOC}$ and the re-discharge open circuit voltage curve $\delta_{\gamma\text{-}SOC}$ obtained by the actual measurement of data collected when actually charging and discharging the secondary battery 10, intermittent data that is obtained by getting or sampling corresponding open circuit voltages at each certain SOC interval (e.g. at each 1% interval) from the data could be used as the discharge basic open circuit voltage curve the re-charge open circuit voltage curve $\gamma_{SOC}$ and the β, re-discharge open circuit voltage curve $\delta_{\gamma\text{-}SOC}$. By using such intermittent data, a data capacity in the controller 20 can be further reduced.

Figure 12:
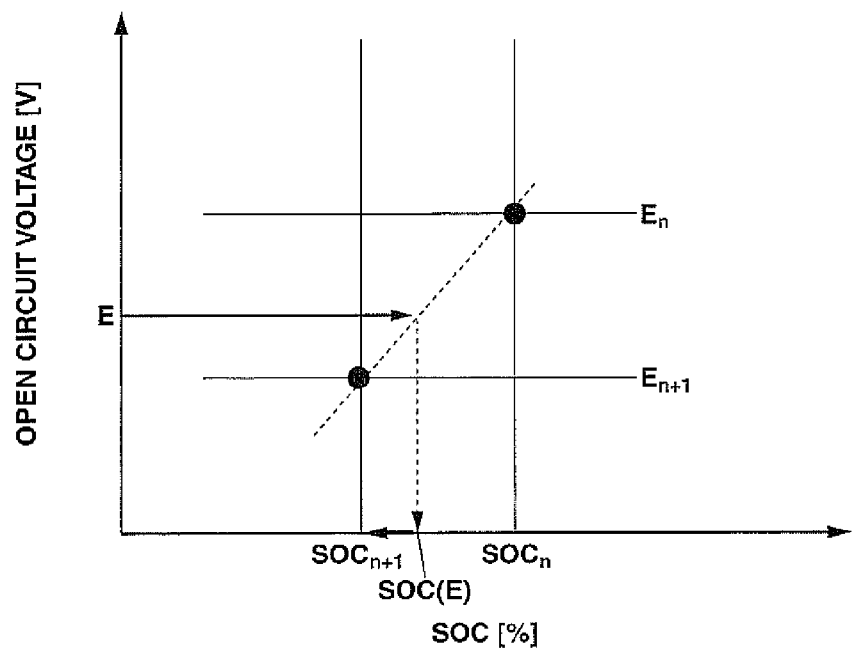
FIG. 12 is a drawing for explaining a method of calculating a current SOC of the secondary battery 10 according to the other embodiment.

In the case where the intermittent data is used, a method for determining the current SOC of the secondary battery 10 from the calculated open circuit voltages using data approximation can be employed in the controller 20. For instance, as shown in FIG. 12, in the intermittent data, a current open circuit voltage of the secondary battery 10 is E, an open circuit voltage whose corresponding SOC is stored and which has a value that is greater than the current open circuit voltage E of the secondary battery 10 and is closest to the open circuit voltage E is $E_n$, and an open circuit voltage whose corresponding SOC is stored and which has a value that is equal to or smaller than the current open circuit voltage E of the secondary battery 10 and is closest to the open circuit voltage E is $E_{n+1}$, then SOCs corresponding to these open circuit voltages $E_n$ and $E_{n+1}$ are $SOC_n$ and $SOC_{n+1}$. In this case, SOC(E) that is an SOC corresponding to the current open circuit voltage E of the secondary battery 10 can be calculated according to the following expressions (3) and (4).

If $0 \leq (E-E_n)/(E_{n+1}-E_n) < 0.5$, $SOC(E)=SOC_n$ \hfill (3)

If $0.5 \leq (E-E_n)/(E_{n+1}-E_n) \leq 1$, $SOC(E)=SOC_{n+1}$ \hfill (4)

Or, the first embodiment could be configured so that, as the re-charge open circuit voltage curve $\gamma_{SOC}$ set for each charging changeover $SOC_{charge}$, the voltage curve is intermittently set at each predetermined SOC interval (e.g. at each 1% interval) and this data is stored. Also in this case, the current SOC of the secondary battery 10 could be calculated according to the above expressions (3) and (4) using the re-charge open circuit voltage curve $\gamma_{SOC}$ having a closest charging changeover $SOC_{charge}$, which is stored in the controller 20. Further, likewise, the first embodiment could be configured so that, as the re-discharge open circuit voltage curve $\delta_{\gamma\text{-}SOC}$ set for each charging changeover $SOC_{charge}$ and each discharging changeover $SOC_{discharge}$, the voltage curve is intermittently set at each predetermined SOC interval (e.g. at each 1% interval) and this data is stored. Also in this case, in the same manner as the above, the current SOC of the secondary battery 10 could be calculated. Especially by intermittently storing the re-charge open circuit voltage curve $\gamma_{SOC}$ and the re-discharge open circuit voltage curve $\delta_{\gamma\text{-}SOC}$ in this way, the data capacity in the controller 20 can be further reduced.

The above first embodiment employs a method for determining the current SOC of the secondary battery 10 from the current open circuit voltage of the secondary battery 10 on the basis of the discharge basic open circuit voltage curve $\beta$, the re-charge open circuit voltage curve $\gamma_{SOC}$ and the re-discharge open circuit voltage curve $\delta_{\gamma\text{-}SOC}$. However, instead of this method, it is possible to calculate the current SOC of the secondary battery 10 on the basis of a current summation. That is, the charge-discharge current detected by the ammeter 40 from a discharge start time is continuously summed up, and on the basis of a summation result, the current SOC of the secondary battery 10 can be calculated. In this case, for instance, by making a calculation of the SOC by the current summation at a predetermined first interval (e.g. 10 m sec interval) and also by making a calculation of the SOC based on the above-mentioned discharge basic open circuit voltage curve $\beta$, the re-charge open circuit voltage curve $\gamma_{SOC}$ and the re-discharge open circuit voltage curve $\delta_{\gamma\text{-}SOC}$ at a predetermined second interval (e.g. several minutes~several tens of minutes) which is longer than the first interval, a calculation result of the SOC by the current summation can be corrected according to a calculation result of the SOC based on the discharge basic open circuit voltage curve $\beta$, the re-charge open circuit voltage curve $\gamma_{SOC}$ and the re-discharge open circuit voltage curve $\delta_{\gamma\text{-}SOC}$. Especially by using this method in particular, while the calculation of the SOC is made by the current summation which has a relatively light operation load, the calculation result of the SOC by the current summation is corrected according to the calculation result of the SOC based on the discharge basic open circuit voltage curve $\beta$, the re-charge open circuit voltage curve $\gamma_{SOC}$ and the re-discharge open circuit voltage curve $\delta_{\gamma\text{-}SOC}$. This increases the calculation accuracy of the SOC.

Further, the above first embodiment shows, as the example, the configuration in which the re-discharge open circuit voltage curve $\delta_{\gamma\text{-}SOC}$ is set for each charging changeover $SOC_{charge}$ and each discharging changeover $SOC_{discharge}$. However, the first embodiment could be configured to set one re-discharge open circuit voltage curve $\delta_{\gamma\text{-}SOC}$ for only the charging changeover $SOC_{charge}$. That is, one re-charge open circuit voltage curve $\gamma_{SOC}$ and one re-discharge open circuit voltage curve $\delta_{\gamma\text{-}SOC}$ could be set for the charging changeover $SOC_{charge}$. Here, when referring to FIGS. 7 and 8, also in a case where the charging changeover $SOC_{charge}$ is the same $SOC_2$ but the discharging changeover $SOC_{discharge}$ is different, such as $SOC_4$ and $SOC_5$, the secondary battery 10 of the present embodiment has a tendency for both the open circuit voltage curves during the discharge to be relatively close together.

Therefore, in the present embodiment, one re-charge open circuit voltage curve $\gamma_{SOC}$ and one re-discharge open circuit voltage curve $\delta_{\gamma\text{-}SOC}$ are set for each charging changeover $SOC_{charge}$. Then, except that this is used, the current SOC of the secondary battery 10 could be calculated in the same manner as the first embodiment. Especially when such configuration is employed, the current SOC of the secondary battery 10, using the positive electrode active material showing the difference of the open circuit voltage curve between during the charge and the discharge, can be calculated accurately while reducing the data to be stored and lightening an operation load.

The method of setting one re-charge open circuit voltage curve $\gamma_{SOC}$ and one re-discharge open circuit voltage curve $\delta_{\gamma\text{-}SOC}$ for each charging changeover $SOC_{charge}$ is not especially limited. For instance, in the same manner as the first embodiment, one re-charge open circuit voltage curve $\gamma_{SOC}$ and one re-discharge open circuit voltage curve $\delta_{\gamma\text{-}SOC}$ are stored for each charging changeover $SOC_{charge}$ in the controller 20, then this could be obtained when the state is changed from the charge to the discharge. Or alternatively, each time the state is changed from the charge to the discharge, one re-charge open circuit voltage curve $\gamma_{SOC}$ and one re-discharge open circuit voltage curve $\delta_{\gamma\text{-}SOC}$ which correspond to the charging changeover $SOC_{charge}$ could be calculated. Furthermore, the method of setting the re-discharge open circuit voltage curve $\delta_{\gamma\text{-}SOC}$ corresponding to the charging changeover $SOC_{charge}$ is not especially limited. For instance, a middle $SOC_{mid}$ ($SOC_{mid}=(100-SOC_{charge})/2$) from the charging changeover $SOC_{charge}$ to the full charge is calculated. Then, from the middle $SOC_{mid}$, the open circuit voltage curve during the discharge when performing the discharge can be the re-discharge open circuit voltage curve $\delta_{\gamma\text{-}SOC}$.

In the above embodiments, the secondary battery 10 corresponds to a secondary battery of the present invention, the controller 20 corresponds to a storing unit or means, an SOC calculating unit or means, a charging start SOC detecting unit or means, first and second obtaining units or means, first to third storing units or means, first to third SOC calculating units or means, a charge-discharge current summing unit or means and a correcting unit or means of the present invention.

Although the embodiments of the present invention has been explained above, the embodiments are described in order to facilitate an understanding of the present invention, and are not described to limit the present invention. Thus, each element or component disclosed in the above embodiments includes all design modifications and equivalents belonging to the technical scope of the present invention.

The invention claimed is:

1. A control device of a secondary battery using, as a positive electrode material, a positive electrode active material that shows a difference of an open circuit voltage curve between during charge and discharge, comprising:

a storing unit that stores a reference SOC-open circuit voltage curve showing a relationship between an SOC and an open circuit voltage, which becomes a reference upon calculating a current SOC of the secondary battery; and an SOC calculating unit that calculates the current SOC of the secondary battery from a current open circuit voltage of the secondary battery on the basis of the reference SOC-open circuit voltage curve, and during the charge of the secondary battery, the SOC calculating unit calculating, as the current SOC of the secondary battery, a value that is lower than a value of the SOC corresponding to the current open circuit voltage of the secondary battery on the reference SOC-open circuit voltage curve, and during the discharge of the secondary battery, the SOC calculating unit calculating, as the current SOC of the secondary battery, a value that is higher than the value of the SOC corresponding to the current open circuit voltage of the secondary battery on the reference SOC-open circuit voltage curve.

2. The control device of the secondary battery as claimed in claim 1, wherein:

during the charge of the secondary battery, the SOC calculating unit calculates, as the current SOC of the secondary battery, a value that is obtained by multiplying the value of the SOC corresponding to the current open circuit voltage of the secondary battery on the reference SOC-open circuit voltage curve by a predetermined first correction factor that is less than 1, and during the discharge of the secondary battery, the SOC calculating unit calculates, as the current SOC of the secondary battery, a value that is obtained by multiplying the value of the SOC corresponding to the current open circuit voltage of the secondary battery on the reference SOC-open circuit voltage curve by a predetermined second correction factor that is greater than 1.

3. The control device of the secondary battery as claimed in claim 2, wherein:

the SOC calculating unit sets the first correction factor so that the closer to a predetermined fully charged state the SOC of the secondary battery at a charge start is, the closer to 1 the value of the first correction factor is, and the SOC calculating unit sets the second correction factor so that the closer to a predetermined fully discharged state the SOC of the secondary battery at a discharge start is, the closer to 1 the value of the second correction factor is.

4. A control device of a secondary battery using, as a positive electrode material, a positive electrode active material that shows a difference of an open circuit voltage curve between during charge and discharge, comprising:

a charging start SOC detecting unit that detects, as a charging start SOC, an SOC at a time of charging start when performing the charge again after discharging the secondary battery from a fully charged state;

a first obtaining unit that obtains, as charge open circuit voltage information, a relationship between the SOC and an open circuit voltage in a charge process of a case where the charge is performed from the charging start SOC;

a second obtaining unit that obtains, as discharge open circuit voltage information, a relationship between the SOC and the open circuit voltage in a discharge process of a case where the charge is performed from the charging start SOC and afterwards the discharge is performed again; and an SOC calculating unit that calculates a current SOC of the secondary battery, and in a case where the secondary battery is in a charge state after the charge is performed from the charging start SOC, the SOC calculating unit calculating the current SOC of the secondary battery from a current open circuit voltage of the secondary battery on the basis of the charge open circuit voltage information obtained by the first obtaining unit, and in a case where the secondary battery is in a discharge state after the charge is performed from the charging start SOC, the SOC calculating unit calculating the current SOC of the secondary battery from the current open circuit voltage of the secondary battery on the basis of the discharge open circuit voltage information obtained by the second obtaining unit.

5. The control device of the secondary battery as claimed in claim 4, wherein:

the first obtaining unit computes, as the charge open circuit voltage information, the relationship between the SOC and the open circuit voltage in the charge process, which corresponds to the charging start SOC, when the charge of the secondary battery is started, and the second obtaining unit computes, as the discharge open circuit voltage information, the relationship between the SOC and the open circuit voltage in the discharge process, which corresponds to the charging start SOC, when the discharge of the secondary battery is started.

6. The control device of the secondary battery as claimed in claim 4, further comprising:

a storing unit that stores the charge open circuit voltage information and the discharge open circuit voltage information for each charging start SOC, and wherein the first obtaining unit reads the charge open circuit voltage information corresponding to the charging start SOC from the storing unit when the charge of the secondary battery is started, and the second obtaining unit reads the discharge open circuit voltage information corresponding to the charging start SOC from the storing unit when the discharge of the secondary battery is started.

7. A control device of a secondary battery using, as a positive electrode material, a positive electrode active material that shows a difference of an open circuit voltage curve between during charge and discharge, comprising:

a first storing unit that stores, as basic discharge open circuit voltage information, a relationship between an SOC and an open circuit voltage in a discharge process of a case where the secondary battery is charged up to a predetermined fully charged state and afterwards the secondary battery is discharged from the fully charged state;

a second storing unit that stores, as re-charge open circuit voltage information, a relationship between the SOC and the open circuit voltage in a charge process of a case where, after discharging the secondary battery from the fully charged state, the charge is performed again, for each charging start SOC upon performing the charge again;

a first SOC calculating unit that calculates a current SOC of the secondary battery when discharging the secondary battery from the fully charged state on the basis of the basic discharge open circuit voltage information; and a second SOC calculating unit that calculates the current SOC of the secondary battery when performing the charge again after discharging the secondary battery from the fully charged state on the basis of the re-charge open circuit voltage information.

8. The control device of the secondary battery as claimed in claim 7, further comprising:

a third storing unit that stores, as re-discharge open circuit voltage information, a relationship between the SOC and the open circuit voltage in the discharge process of a case where, after discharging the secondary battery from the fully charged state and performing the charge again, the discharge is performed again, for each charging start SOC upon performing the charge again and each discharging start SOC upon performing the discharge again; and a third SOC calculating unit that calculates the current SOC of the secondary battery when performing the discharge again after discharging the secondary battery from the fully charged state and charging the secondary battery again on the basis of the re-discharge open circuit voltage information.

9. The control device of the secondary battery as claimed in claim 8, wherein:

the third storing unit stores, as the re-discharge open circuit voltage information, a relationship between the SOC and the open circuit voltage in the discharge process of a case where the discharge is performed from the discharging start SOC upon performing the discharge again to the charging start SOC upon performing the charge again, and the third SOC calculating unit calculates the current SOC of the secondary battery on the basis of the re-discharge open circuit voltage information until the discharge is performed to the charging start SOC upon performing the charge again, and calculates the current SOC of the secondary battery on the basis of the basic discharge open circuit voltage information when the discharge is performed beyond the charging start SOC upon performing the charge again.

10. The control device of the secondary battery as claimed in claim 8, wherein:

the first storing unit, the second storing unit and the third storing unit store, as the basic discharge open circuit voltage information, the re-charge open circuit voltage information and the re-discharge open circuit voltage information, the relationship between the SOC and the open circuit voltage in the discharge process or in the charge process intermittently at each predetermined SOC interval, and the first SOC calculating unit, the second SOC calculating unit and the third SOC calculating unit calculate the current SOC of the secondary battery from the current open circuit voltage of the secondary battery according to following expressions (I) and (II);

If $0 \leq (E-E_n)/(E_{n+1}-E_n) < 0.5$, $SOC(E)=SOC_n$ (I)

If $0.5 \leq (E-E_n)/(E_{n+1}-E_n) \leq 1$, $SOC(E)=SOC_{n+1}$ (II)

(in the expression (I) and (II),

E is the current open circuit voltage of the secondary battery, $E_n$ is an open circuit voltage whose corresponding SOC is stored in the first storing unit, the second storing unit and the third storing unit and which has a value that is greater than the current open circuit voltage E of the secondary battery and is closest to the current open circuit voltage E of the secondary battery, $E_{n+1}$ is an open circuit voltage whose corresponding SOC is stored in the first storing unit, the second storing unit and the third storing unit and which has a value that is equal to or smaller than the current open circuit voltage E of the secondary battery and is closest to the current open circuit voltage E of the secondary battery, $SOC_n$ is an SOC corresponding to the open circuit voltage $E_n$, $SOC_{n+1}$ is an SOC corresponding to the open circuit voltage $E_{n+1}$, and SOC(E) is an SOC corresponding to the current open circuit voltage E of the secondary battery).

11. The control device of the secondary battery as claimed in claim 7, wherein:

the positive electrode active material contains a compound expressed by a following general expression (III)

$a$Li[Li$_{1/3}$Mn$_{2/3}$]O$_2$·(1-$a$)Li[Ni$_w$Co$_x$Mn$_y$A$_z$]O$_2$ (III)

(in the expression (III), $0<a<1$, $w+x+y+z=1$, $0 \leq w, x, y, z \leq 1$, A is metallic element).

12. The control device of the secondary battery as claimed in claim 8, further comprising:

a charge-discharge current summing unit that calculates an SOC based on a current summation by summing up a charge-discharge current of the secondary battery, and wherein the charge-discharge current summing unit is provided with a correcting unit that, on the basis of the current SOC of the secondary battery calculated by the first SOC calculating unit or the second SOC calculating unit or the third SOC calculating unit, corrects the SOC based on the current summation calculated by the charge-discharge current summing unit.

13. An SOC detection method of a secondary battery using, as a positive electrode material, a positive electrode active material that shows a difference of an open circuit voltage curve between during charge and discharge, the SOC detection method comprising:

detecting whether the secondary battery is in a charge state or in a discharge state;

when the secondary battery is in the charge state, calculating, as a current SOC of the secondary battery, a value that is lower than a value of an SOC corresponding to a current open circuit voltage of the secondary battery on a predetermined reference SOC-open circuit voltage curve showing a relationship between the SOC and the open circuit voltage, which becomes a reference upon calculating the current SOC of the secondary battery; and when the secondary battery is in the discharge state, calculating, as the current SOC of the secondary battery, a value that is higher than the value of the SOC corresponding to the current open circuit voltage of the secondary battery on the reference SOC-open circuit voltage curve.

14. An SOC detection method of a secondary battery using, as a positive electrode material, a positive electrode active material that shows a difference of an open circuit voltage curve between during charge and discharge, the SOC detection method comprising:

storing, as basic discharge open circuit voltage information, a relationship between an SOC and an open circuit voltage in a discharge process of a case where the secondary battery is charged up to a predetermined fully charged state and afterwards the secondary battery is discharged from the fully charged state;

storing, as re-charge open circuit voltage information, a relationship between the SOC and the open circuit voltage in a charge process of a case where, after discharging the secondary battery from the fully charged state, the charge is performed again, for each charging start SOC upon performing the charge again;

storing, as re-discharge open circuit voltage information, a relationship between the SOC and the open circuit voltage in the discharge process of a case where, after discharging the secondary battery from the fully charged state and performing the charge again, the discharge is performed again, for each charging start SOC upon performing the charge again and each discharging start SOC upon performing the discharge again;

calculating a current SOC of the secondary battery when discharging the secondary battery from the fully charged state on the basis of the basic discharge open circuit voltage information;

calculating the current SOC of the secondary battery when performing the charge again after discharging the secondary battery from the fully charged state on the basis of the re-charge open circuit voltage information; and calculating the current SOC of the secondary battery when performing the discharge again after discharging the secondary battery from the fully charged state and charging the secondary battery again on the basis of the re-discharge open circuit voltage information.

* * * * *